(12) United States Patent
Lee et al.

(10) Patent No.: US 11,489,031 B2
(45) Date of Patent: Nov. 1, 2022

(54) DISPLAY DEVICE HAVING REDUCED DISTANCE BETWEEN CAPACITOR ELECTRODES IN WHITE SUB PIXEL

(71) Applicant: LG Display Co., Ltd., Seoul (KR)

(72) Inventors: SiKyu Lee, Seongnam-si (KR); Youngho Kim, Seoul (KR); JaeHyun Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 122 days.

(21) Appl. No.: 17/138,136

(22) Filed: Dec. 30, 2020

(65) Prior Publication Data

US 2021/0202643 A1    Jul. 1, 2021

(30) Foreign Application Priority Data

Dec. 31, 2019 (KR) .................. 10-2019-0179701

(51) Int. Cl.
*H01L 27/12* (2006.01)
*H01L 27/32* (2006.01)

(52) U.S. Cl.
CPC ...... *H01L 27/3265* (2013.01); *H01L 27/3262* (2013.01); *H01L 27/1214* (2013.01); *H01L 27/322* (2013.01); *H01L 27/3258* (2013.01)

(58) Field of Classification Search
CPC ............ H01L 27/3265; H01L 27/3262; H01L 27/1214; H01L 27/3258
USPC ............................................... 257/71
See application file for complete search history.

(56) References Cited

U.S. PATENT DOCUMENTS

| | | | |
|---|---|---|---|
| 2010/0013748 A1* | 1/2010 | Cok | H04N 9/67 382/167 |
| 2016/0181328 A1* | 6/2016 | Zhang | H01L 27/3213 257/40 |
| 2019/0066545 A1* | 2/2019 | Jung | G06F 1/1652 |
| 2019/0165065 A1* | 5/2019 | Kong | H01L 27/3272 |

FOREIGN PATENT DOCUMENTS

KR    10-2008-0086730 A    9/2008

* cited by examiner

*Primary Examiner* — Phuc T Dang
(74) *Attorney, Agent, or Firm* — Polsinelli PC

(57) ABSTRACT

A display device includes a substrate in which a plurality of sub pixels including an emission area and a circuit area is defined. The display device further includes a storage capacitor disposed in the circuit area and including a first capacitor electrode and a second capacitor electrode on the first capacitor electrode. The display device further includes a driving transistor disposed in the circuit area. The display device further includes a light emitting diode disposed in each of the plurality of sub pixels. The plurality of sub pixels includes a red sub pixel, a green sub pixel, a blue sub pixel, and a white sub pixel. And a distance between the first capacitor electrode and the second capacitor electrode in the white sub pixel is smaller than a distance between the first capacitor electrode and the second capacitor electrode in the red sub pixel, the green sub pixel, and the blue sub pixel.

22 Claims, 7 Drawing Sheets

DISPLAY DEVICE HAVING REDUCED DISTANCE BETWEEN CAPACITOR ELECTRODES IN WHITE SUB PIXEL

CROSS-REFERENCE TO RELATED APPLICATION

This application claims the priority of Korean Patent Application No. 10-2019-0179701 filed on Dec. 31, 2019, which is hereby incorporated by reference in its entirety.

BACKGROUND

Field of the Disclosure

The present disclosure relates to a display device, and more particularly, to a display device which improves the luminance by changing a structure of a storage capacitor.

Description of the Background

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

In the meantime, the display device includes a bank disposed between a plurality of sub pixels to reduce color mixture of the plurality of sub pixels and color mixture between the plurality of sub pixels. However, there are problems in that in order to form the bank, an additional process is necessary and moisture penetrates into the display device through the bank formed of an organic material. Therefore, studies for a display device which does not include a bank have been conducted to simplify the process and minimize moisture penetration.

SUMMARY

Accordingly, the present disclosure is to provide a display device which reduces an area of a storage capacitor by changing a structure of the storage capacitor of a white sub pixel.

The present disclosure is also to provide a display device which increases an aperture ratio of a white sub pixel and improves a luminance.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device includes a substrate in which a plurality of sub pixels including an emission area and a circuit area is defined. The display device further includes a storage capacitor disposed in the circuit area and including a first capacitor electrode and a second capacitor electrode on the first capacitor electrode. The display device further includes a driving transistor disposed in the circuit area. The display device further includes a light emitting diode disposed in each of the plurality of sub pixels. The plurality of sub pixels includes a red sub pixel, a green sub pixel, a blue sub pixel, and a white sub pixel. A distance between the first capacitor electrode and the second capacitor electrode in the white sub pixel is smaller than a distance between the first capacitor electrode and the second capacitor electrode in the red sub pixel, the green sub pixel, and the blue sub pixel.

According to another aspect of the present disclosure, there is provided a display device. The display device includes a substrate in which a plurality of sub pixels including a red sub pixel, a green sub pixel, a blue sub pixel, and a white sub pixel is defined. The display device further includes a storage capacitor disposed in each of the plurality of sub pixels and including a first capacitor electrode and a second capacitor electrode on the first capacitor electrode. The display device further includes a driving transistor disposed in each of the plurality of sub pixels. The display device further includes a light emitting diode disposed in each of the plurality of sub pixels. The number of insulating layers between the first capacitor electrode and the second capacitor electrode in the white sub pixel is smaller than the number of insulating layers between the first capacitor electrode and the second capacitor electrode in the red sub pixel, the green sub pixel, and the blue sub pixel.

According to yet another aspect of the present disclosure, there is provided a display device. The display device includes a substrate in which a plurality of sub pixels including an emission area and a circuit area is defined. The display device further includes a storage capacitor disposed in the circuit area and including a first capacitor electrode and a second capacitor electrode on the first capacitor electrode. The display device further includes a driving transistor disposed in the circuit area and including a first active layer and a first gate electrode on the first active layer. The display device further includes a light emitting diode disposed in each of the plurality of sub pixels. The plurality of sub pixels includes a red sub pixel, a green sub pixel, a blue sub pixel, and a white sub pixel. One of the first capacitor electrode and the second capacitor electrode of the white sub pixel is disposed on the same layer as the first active layer. Both the first capacitor electrode and the second capacitor electrode of the red sub pixel, the green sub pixel, and the blue sub pixel are disposed on a layer different from the first active layer.

Other detailed matters of the exemplary aspects are included in the detailed description and the drawings.

According to the present disclosure, an area of a storage capacitor may be reduced by reducing a distance between a first capacitor electrode and a second capacitor electrode of a white sub pixel.

According to the present disclosure, the area of the storage capacitor of the white sub pixel is reduced to increase the aperture ratio and the luminance and increase a luminous efficiency of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
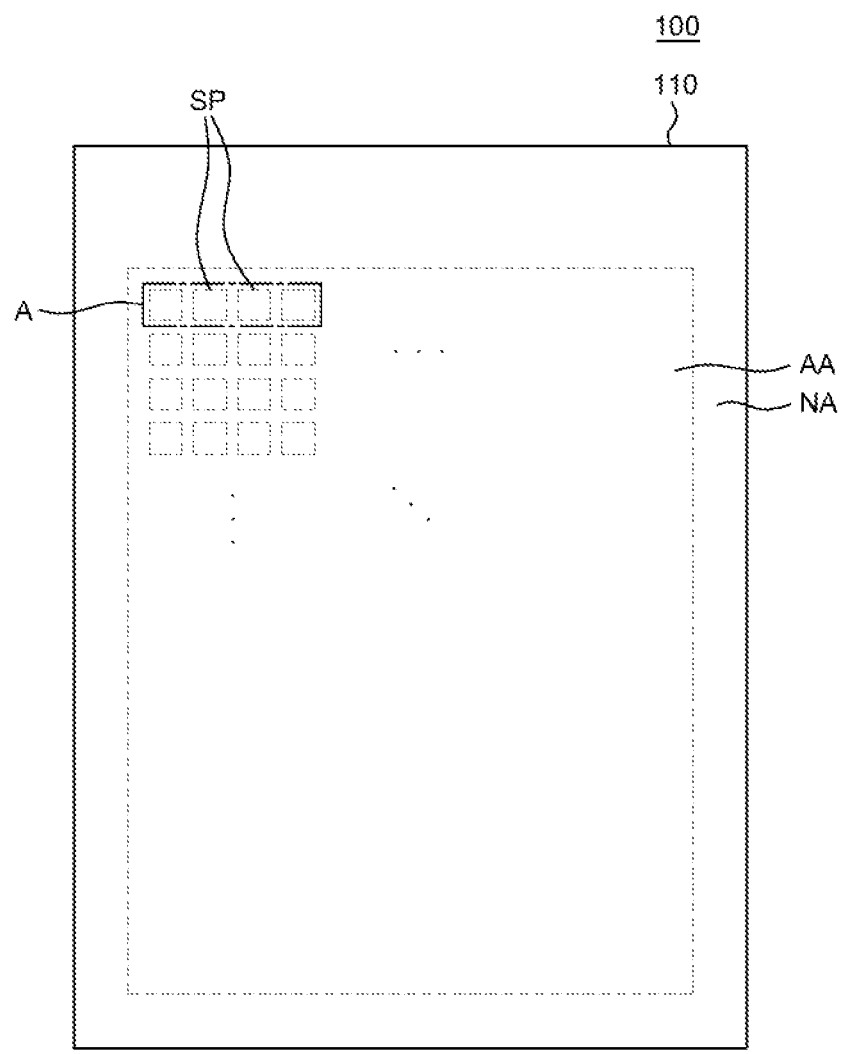
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

FIG. 1 is a plan view of a display device according to an exemplary aspect of the present disclosure. In FIG. 1, for the convenience of description, among various components of the display device 100, only a substrate 110 and a plurality of sub pixels SP are illustrated.

The substrate 110 is a support member for supporting other components of the display device 100 and may be configured by an insulating material. For example, the substrate 110 may be formed of glass or resin. Further, the substrate 110 may be configured to include plastics such as polymer or polyimide or may be formed of a material having flexibility.

The substrate 110 includes a display area AA and a non-display area NA.

The display area AA is an area where images are displayed. In the display area AA, a plurality of sub pixels SP which displays images and a driving circuit which drives the plurality of sub pixels SP may be disposed. The driving circuit may include various thin film transistors, storage capacitors, and wiring lines for driving the sub pixels SP. For example, the circuit may include various components such as a driving transistor, a switching transistor, a sensing transistor, a storage capacitor, a gate line, and a data line, but is not limited thereto.

The non-display area NA is an area where no image is displayed and various wiring lines and driving ICs for driving the sub pixels SP are disposed. For example, in the non-display area NA, various driving ICs such as a gate driver IC and a data driver IC may be disposed.

In the meantime, even though in FIG. 1, it is illustrated that the non-display area NA encloses the display area AA, the non-display area NA may be an area extending from one side of the display area AA, but is not limited thereto.

The plurality of sub pixels SP is disposed in the display area AA of the substrate 110. Each of the plurality of sub pixels SP is an individual unit which emits light and in each of the plurality of sub pixels SP, a light emitting diode and a driving circuit are formed. For example, the plurality of sub pixels SP may include a red sub pixel, a green sub pixel, a blue sub pixel, and a white sub pixel, but is not limited thereto.

Hereinafter, a driving circuit of the plurality of sub pixels SP will be described in more detail with reference to FIG. 2 together.

Figure 2:
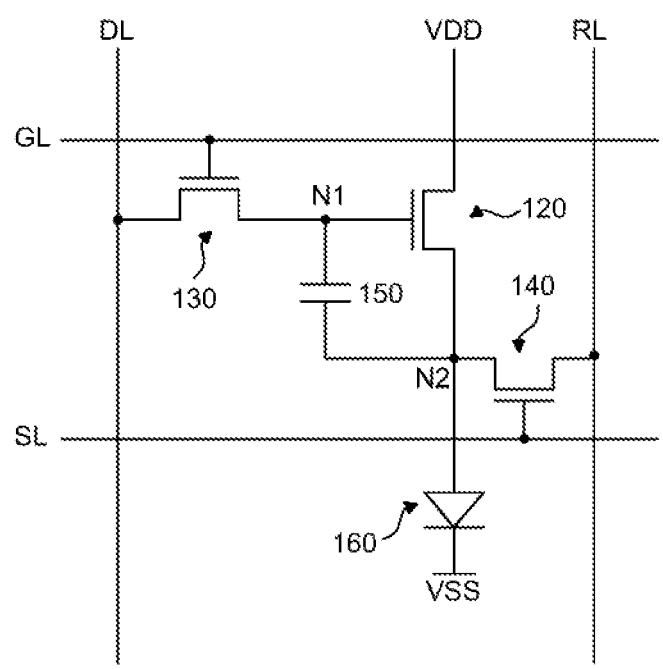
FIG. 2 is a circuit diagram of a sub pixel of a display device according to an exemplary aspect of the present disclosure.

FIG. 2 is a circuit diagram of a sub pixel of a display device according to an exemplary aspect of the present disclosure.

Referring to FIG. 2, a driving circuit which drives each light emitting diode 160 of the plurality of sub pixels SP includes a first transistor 120, a second transistor 130, a third transistor 140, a storage capacitor 150, a gate line GL, a data line DL, a high potential power line VDD, a sensing line SL, and a reference line RL.

Each of the first transistor 120, the second transistor 130, and the third transistor 140 included in the driving circuit of the sub pixel SP includes a gate electrode, a source electrode, and a drain electrode. The first transistor 120, the second transistor 130, and the third transistor 140 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current may flow from the drain electrode to the source electrode.

Hereinafter, the description will be made under the assumption that the first transistor 120, the second transistor 130, and the third transistor 140 are N-type thin film transistors in which the current flows from the drain electrode to the source electrode, but is not limited thereto.

The first transistor 120 includes a first active layer, a first gate electrode, a first source electrode, and a first drain electrode. The first gate electrode is connected to a first node N1, the first source electrode is connected to a first electrode of the light emitting diode 160, and the first drain electrode is connected to the high potential power line VDD. When a voltage of the first node N1 is higher than a threshold voltage, the first transistor 120 is turned on and when the voltage of the first node N1 is lower than the threshold voltage, the first transistor 120 may be turned off. When the first transistor 120 is turned on, the first transistor 120 may transmit a power signal from the high potential power line VDD to the light emitting diode 160. The first transistor 120 may be referred to as a driving transistor.

The second transistor 130 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor 130 may be turned on or off based on a gate signal from the gate line GL. When the second transistor 130 is turned on, a data signal from the data line DL may be charged in the first node N1. The second transistor 130 may be referred to as a switching transistor.

The third transistor 140 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor 140 may be turned on or off based on a sensing signal from the sensing line SL. When the third transistor 140 is turned on, a reference voltage from the reference line RL may be transmitted to the storage capacitor 150. The third transistor 140 may be referred to as a sensing transistor. In the meantime, even though in FIG. 2, it is illustrated that the gate line GL and the sensing line SL are separate wiring lines, the gate line GL and the sensing line SL may be implemented as one wiring line.

The storage capacitor 150 includes a first capacitor electrode and a second capacitor electrode. The first capacitor electrode is connected to the first node N1 and the second capacitor electrode is connected to the second node N2. The storage capacitor 150 maintains a potential difference between the first gate electrode and the first source electrode of the first transistor 120 while the light emitting diode 160 emits light, so that a constant current may be supplied to the light emitting diode 160.

The first electrode of the light emitting diode 160 is connected to the second node N2 and the second electrode is connected to a low potential power line VSS. The light emitting diode 160 is supplied with a current from the first transistor 120 to emit light. In this case, a low potential power signal from the low potential power line may be a ground voltage.

In the meantime, in FIG. 2, it is described that the driving circuit of the sub pixel SP of the display device 100 according to the exemplary aspect of the present disclosure has a 3T1C structure including three transistors and one storage capacitor. However, the number and a connection relationship of the transistors and the storage capacitors may vary in various ways depending on a design and are not limited thereto.

Hereinafter, the plurality of sub pixels SP will be described in more detail with reference to FIGS. 3 and 4.

Figure 3:
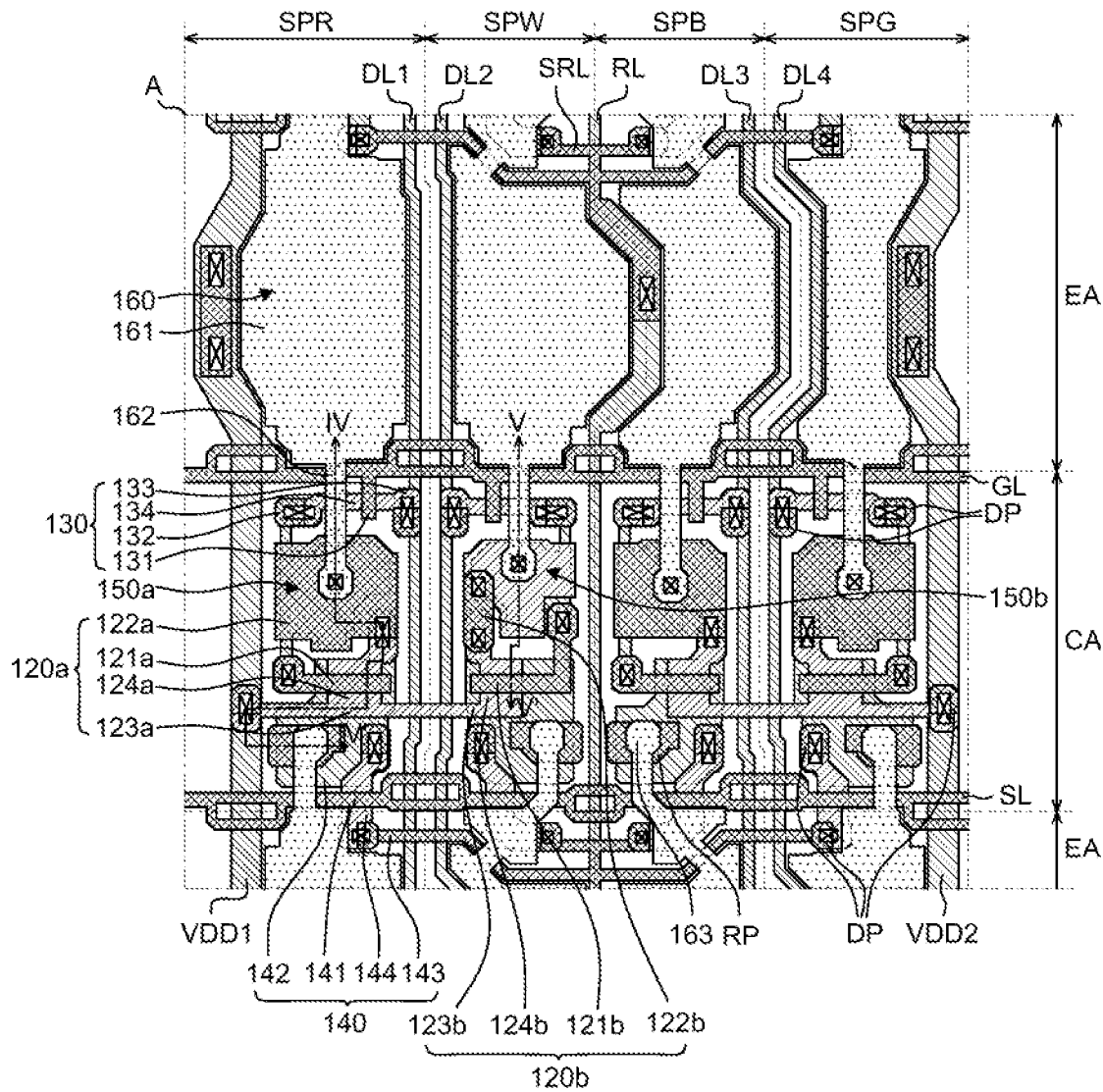
FIG. 3 is an enlarged plan view of area A of FIG. 1.

FIG. 3 is an enlarged plan view of an area A of FIG. 1. FIG. 4 is a cross-sectional view taken along line IV-IV' of FIG. 3. For the convenience of illustration, in FIG. 3, only the components also including the first electrode 161 on a substrate 110 of FIG. 4 are illustrated and the plurality of color filters is not illustrated. FIG. 4 is a cross-sectional view of a red sub pixel SPR, but a cross-sectional structure of the red sub pixel SPR may be substantially the same as the cross-sectional structure of a blue sub pixel SPB and a green sub pixel SPG.

Figure 4:
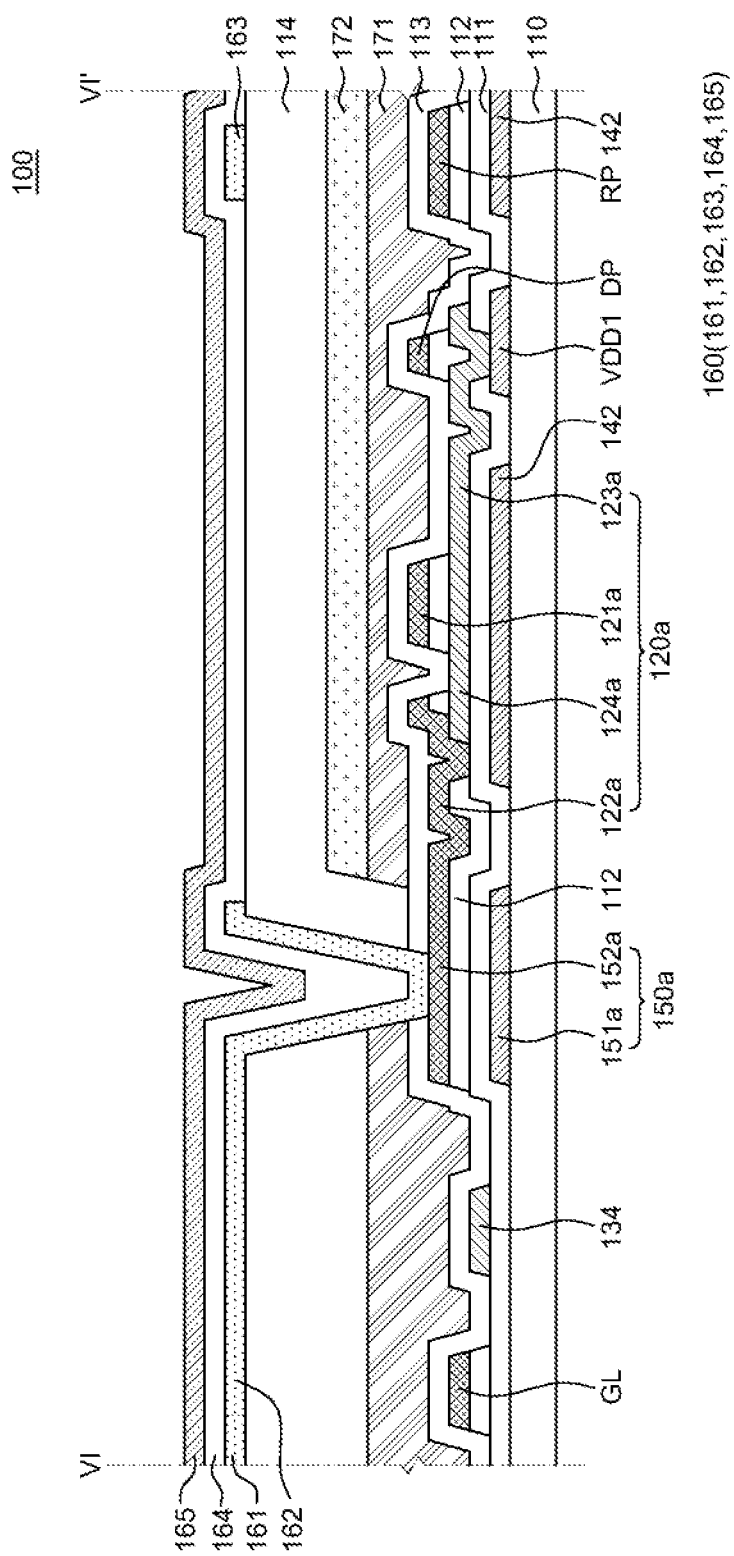
FIG. 4 is a cross-sectional view taken along line IV-IV' of FIG. 3.

Referring to FIGS. 3 and 4, a display device 100 according to an exemplary aspect of the present disclosure includes a substrate 110, a gate line GL, a data line DL, a high potential power line VDD, a sensing line SL, a reference line RL, a light emitting diode 160, a first transistor 120, a second transistor 130, a third transistor 140, a storage capacitor 150, color filters 171 and 172, a buffer layer 111, a gate insulating layer 112, a passivation layer 113, and a planarization layer 114.

First, referring to FIG. 3, the plurality of sub pixels SP includes a red sub pixel SPR, a white sub pixel SPW, a blue sub pixel SPB, and a green sub pixel SPG and each sub pixel SP includes an emission area EA and a circuit area CA.

The emission area EA is an area where one color light is independently emitted and the light emitting diode 160 may be disposed therein. An emission area EA of the red sub pixel SPR is a red emission area which emits red light, an emission area EA of the white sub pixel SPW is a white emission area which emits white light, an emission area EA of the blue sub pixel SPB is a blue emission area which emits blue light, and an emission area EA of the green sub pixel SPG is a green emission area which emits green light.

In the circuit area CA, a driving circuit for driving the plurality of light emitting diodes 160 is disposed and for example, the first transistor 120, the second transistor 130, the third transistor 140, and the storage capacitor 150 are disposed.

The circuit areas CA of the red sub pixel SPR, the blue sub pixel SPB, and the green sub pixel SPG may have a similar structure. The white sub pixel SPW may have a different structure from the red sub pixel SPR, the blue sub pixel SPB, and the green sub pixel SPG. Specifically, a first transistor 120a and a storage capacitor 150a of each of the red sub pixel SPR, the blue sub pixel SPB, and the green sub pixel SPG may have different structures from those of a first transistor 120b and a storage capacitor 150b of the white sub pixel SPW. This will be described below with reference to FIG. 5.

Referring to FIGS. 3 and 4 together, the plurality of high potential power lines VDD, the plurality of data lines DL, and the reference line RL extending in a column direction are disposed between the plurality of sub pixels SP on the substrate 110. The plurality of high potential power lines VDD, the plurality of data lines DL, and the reference line RL are disposed on the same layer of the substrate 110 and formed of the same material. For example, the plurality of high potential power lines VDD, the plurality of data lines DL, and the reference line RL may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDD is lines which transmit the power signal to the plurality of sub pixels SP and includes a first high potential power line VDD1 and a second high potential power line VDD2. Two sub pixels SP which are adjacent to each other in a row direction may share one high potential power line VDD among the plurality of high potential power lines VDD. For example, the first high potential power line VDD1 is disposed at a left side of the red sub pixel SPR to transmit the power signal to the first transistor 120a of the red sub pixel SPR and a first transistor 120b of the white sub pixel SPW. The second high potential power line VDD2 is disposed at a right side of the green sub pixel SPG to transmit the power signal to the first transistors 120a of the blue sub pixel SPB and the green sub pixel SPG.

The plurality of data lines DL is lines which transmit a data signal to the plurality of sub pixels SP and includes a first data line DL1, a second data line DL2, a third data line DL3, and a fourth data line DL4. The first data line DL1 is disposed between the red sub pixel SPR and the white sub pixel SPW, that is, at a right side of the red sub pixel SPR to transmit the data signal to the second transistor 130 of the red sub pixel SPR. The second data line DL2 is disposed between the first data line DL1 and the white sub pixel SPW, that is, at a left side of the white sub pixel SPW to transmit the data signal to the second transistor 130 of the white sub pixel SPW. The third data line DL3 is disposed between the blue sub pixel SPB and the green sub pixel SPG, that is, at a right side of the blue sub pixel SPB to transmit the data signal to the second transistor 130 of the blue sub pixel SPB. The fourth data line DL4 is disposed between the third data line DL3 and the green sub pixel SPG, that is, at a left side of the green sub pixel SPG to transmit the data signal to the second transistor 130 of the green sub pixel SPG.

The reference line RL transmits a reference signal to each of the plurality of sub pixels SP and may be disposed between the white sub pixel SPW and the blue sub pixel SPB. The plurality of sub pixels SP which forms one pixel may share one reference line RL. The reference line RL may transmit the reference signal to the third transistors 140 of the red sub pixel SPR, the white sub pixel SPW, the blue sub pixel SPB, and the green sub pixel SPG.

The buffer layer 111 is disposed on the plurality of high potential power lines VDD, the plurality of data lines DL, and the reference line RL. The buffer layer 111 may reduce penetration of moisture or impurities from the substrate 110. The buffer layer 111 may be configured by a single layer or a double layer of silicon oxide SiOx or silicon nitride SiNx, but is not limited thereto. However, the buffer layer 111 may be omitted depending on a type of substrate 110 or a type of the thin film transistor, but is not limited thereto.

The first transistor 120a is disposed in the circuit area CA of each of the red sub pixel SPR, the blue sub pixel SPB, and the green sub pixel SPG. The first transistor 120a may include a first gate electrode 121a, a first source electrode 122a, a first drain electrode 123a, and a first active layer 124a. The first transistor 120a which is electrically connected to the first electrode 161 of light emitting diode 160 and the high potential power line VDD may be a driving transistor.

First, the first drain electrode 123a is disposed on the buffer layer 111. The first drain electrode 123a is electrically connected to the plurality of high potential power lines VDD. Specifically, the first drain electrode 123a of the red sub pixel SPR is electrically connected to the first high potential power line VDD1 through a contact hole formed in the buffer layer 111. The first drain electrodes 123a of the blue sub pixel SPB and the green sub pixel SPG are electrically connected to the second high potential power line VDD2 through a contact hole formed in the buffer layer 111.

The first active layer 124a is disposed on the buffer layer 111. The first active layer 124a may be formed of a semiconductor material such as an oxide semiconductor, amorphous silicon, or polysilicon, but is not limited thereto. For example, when the first active layer 124a is formed of an oxide semiconductor, the first active layer 124a is formed by a channel region, a source region, and a drain region and the source region and the drain region may be areas on which the material contained in the first active layer 124a becomes conductive, but are not limited thereto.

In the meantime, the first drain electrode 123a of the red sub pixel SPR and the first drain electrode 123b of the white sub pixel SPW may be integrally formed. The first drain electrodes 123a of the blue sub pixel SPB and the green sub pixel SPG may be integrally formed. Specifically, the first drain electrode 123a of the red sub pixel SPR and the first drain electrode 123b of the white sub pixel SPW may be integrally formed to share one first high potential power line VDD1. For example, the power signal from the first high potential power line VDD1 is transmitted to the first drain electrode 123b of the white sub pixel SPW via the first drain electrode 123a of the red sub pixel SPR. The power signal from the second high potential power line VDD2 is transmitted to the first drain electrode 123a of the blue sub pixel SPB via the first drain electrode 123a of the green sub pixel SPG. However, the present disclosure is not limited thereto, and the first drain electrode 123a of the red sub pixel SPR and the first drain electrode 123b of the white sub pixel SPW are separately formed. Further, the first drain electrode 123a of the blue sub pixel SPB and the first drain electrode 123a of the green sub pixel SPG may be separately formed.

The first active layer 124a and the first drain electrode 123a of each of the red sub pixel SPR, the blue sub pixel SPB, and the green sub pixel SPG may be integrally formed. For example, when a voltage is applied to the first gate electrode 121a of the red sub pixel SPR, the first drain electrode 123a which is integrally formed with the first active layer 124a and formed of a material contained in the first active layer 124a which becomes conductive may transmit the power signal from the first high potential power line VDD1 to the first active layer 124a and the first source electrode 122a. However, the first drain electrode 123a is defined to be integrally formed with the first high potential power line VDD1, but is not limited thereto.

The gate insulating layer 112 is disposed on the first active layer 124a. The gate insulating layer 112 may be a layer which insulates the first gate electrode 121a from the first active layer 124a. The gate insulating layer 112 may be disposed only in an area corresponding to the first gate electrode 121a and conductive layers which are formed of the same material as the first gate electrode 121a by the same process. For example, the gate insulating layer 112 is disposed on the entire surface of the substrate 110 and then removed together when the first gate electrode 121a and the conductive layers disposed on the gate insulating layer 112 are patterned. For example, the gate insulating layer 112 may be configured by a single layer or a double layer of an insulating material such as silicon oxide SiOx or silicon nitride SiNx, but is not limited thereto. The first gate electrode 121a is disposed on the gate insulating layer 112 so as to overlap the first active layer 124a of each of the red sub pixel SPR, the blue sub pixel SPB, and the green sub pixel SPG. The first gate electrode 121a may be configured by a conductive material such as copper (Cu), aluminum (Al), molybdenum (Mo), nickel (Ni), titanium (Ti), chrome (Cr), or an alloy thereof, but is not limited thereto.

The first source electrode 122a which is spaced apart from the first gate electrode 121a is disposed on the gate insulating layer 112 in each of the red sub pixel SPR, the blue sub pixel SPB, and the green sub pixel SPG. The first source electrode 122a may be electrically connected to the first active layer 124a through a contact hole formed in the gate insulating layer 112. The first source electrode 122a is disposed on the same layer as the first gate electrode 121a to be formed of the same material, but is not limited thereto. The first source electrode 122a may be configured by a conductive material such as copper (Cu), aluminum (Al), molybdenum (Mo), nickel (Ni), titanium (Ti), chrome (Cr), or an alloy thereof, but is not limited thereto.

The second transistor 130 is disposed in the circuit area CA of each of the plurality of sub pixels SP. The second transistor 130 includes a second gate electrode 131, a second source electrode 132, a second drain electrode 133, and a second active layer 134. The second transistor 130 which is electrically connected to the gate line GL, the data line DL, and the first gate electrode 121a of the first transistor 120a may be a switching transistor.

First, in each of the plurality of sub pixels SP, the second drain electrode 133 is disposed between the substrate 110 and the buffer layer 111. The second drain electrode 133 is electrically connected to one data line DL among the plurality of data lines DL. The second drain electrode 133 is integrally formed with the plurality of data lines DL to be formed of the same material as the plurality of data lines DL. For example, the second drain electrode 133 of the red sub pixel SPR is integrally formed with the first data line DL1 and the second drain electrode 133 of the white sub pixel SPW is integrally formed with the second data line DL2. Further, the second drain electrode 133 of the blue sub pixel SPB is integrally formed with the third data line DL3 and the second drain electrode 133 of the green sub pixel SPG is integrally formed with the fourth data line DL4. The second drain electrode 133 may be configured by a conductive material such as copper (Cu), aluminum (Al), molybdenum (Mo), nickel (Ni), titanium (Ti), chrome (Cr), or an alloy thereof, but is not limited thereto.

In each of the plurality of sub pixels SP, the second source electrode 132 which is spaced apart from the second drain electrode 133 is disposed between the substrate 110 and the buffer layer 111. The second source electrode 132 is disposed on the same layer as the second drain electrode 133 to be formed of the same material, but is not limited thereto. The second source electrode 132 may be configured by a conductive material such as copper (Cu), aluminum (Al), molybdenum (Mo), nickel (Ni), titanium (Ti), chrome (Cr), or an alloy thereof, but is not limited thereto.

The second active layer 134 is disposed on the buffer layer 111 in each of the plurality of sub pixels SP. The second active layer 134 may be electrically connected to the second source electrode 132 and the second drain electrode 133 through a contact hole formed in the buffer layer 111. The second active layer 134 may be formed of a semiconductor material such as an oxide semiconductor, amorphous silicon, or polysilicon, but is not limited thereto.

In each of the plurality of sub pixels SP, the second gate electrode 131 is disposed on the gate insulating layer 112 so as to overlap the second active layer 134. The second gate electrode 131 may be configured by a conductive material such as copper (Cu), aluminum (Al), molybdenum (Mo), nickel (Ni), titanium (Ti), chrome (Cr), or an alloy thereof, but is not limited thereto.

The second gate electrode 131 extends from the gate line GL. Therefore, the second gate electrode 131 and the gate line GL may be formed of the same material. The gate line GL may be configured by a conductive material such as copper (Cu), aluminum (Al), molybdenum (Mo), nickel (Ni), titanium (Ti), chrome (Cr), or an alloy thereof, but is not limited thereto.

The gate line GL transmits a gate signal to each of the plurality of sub pixels SP and extends in a row direction to traverse the plurality of sub pixels SP. For example, the gate line GL extends between the circuit area CA and the emission area EA of each of the plurality of sub pixels SP in the row direction to intersect the plurality of high potential power lines VDD, the plurality of data lines DL, and the reference line RL extending in the column direction.

The third transistor 140 is disposed in the circuit area CA of each of the plurality of sub pixels SP. The third transistor 140 includes a third gate electrode 141, a third source electrode 142, a third drain electrode 143, and a third active layer 144. The third transistor 140 which is electrically connected to the reference line RL, the sensing line SL, and the second capacitor electrodes 152a and 152b of the storage capacitor 150 may be a sensing transistor.

First, in each of the plurality of sub pixels SP, the third source electrode 142 is disposed between the substrate 110 and the buffer layer 111. The third source electrode 142 is disposed on the same layer as the plurality of high potential power lines VDD, the plurality of data lines DL, and the reference line RL and may be formed of the same material. The third source electrode 142 may be configured by a conductive material such as copper (Cu), aluminum (Al), molybdenum (Mo), nickel (Ni), titanium (Ti), chrome (Cr), or an alloy thereof, but is not limited thereto.

The third source electrode 142 may be electrically connected to the first source electrodes 122a and 122b. Specifically, the third source electrode 142 extends toward the first source electrodes 122a and 122b. The third source electrode 142 is in contact with a part of the first active layers 124a and 124b overlapping the first source electrodes 122a and 122b to be electrically connected to the first source electrodes 122a and 122b. Further, the third source electrode 142 may be electrically connected to the second capacitor electrodes 152a and 152b which form the storage capacitor 150, which will be described below.

In the meantime, the third source electrode 142 may serve as a light shielding layer which blocks light incident onto the first active layers 124a and 124b of the first transistor 120. For example, when light is irradiated onto the first active layers 124a and 124b, a leakage current is generated so that the reliability of the first transistor 120 may be degraded. In this case, the third source electrode 142 which is formed of a conductive material which is not transparent is disposed below the first active layers 124a and 124b and the first gate electrode 121a and 121b to block light which is incident onto the first active layers 124a and 124b from the lower portion of the substrate 110. Therefore, the reliability of the first transistor 120 may be improved.

The third active layer 144 is disposed on the buffer layer 111 in each of the plurality of sub pixels SP. The third active layer 144 is electrically connected to the third source electrode 142 through a contact hole formed in the buffer layer 111 and is electrically connected to the third drain electrode 143 through a contact hole formed in the gate insulating layer 112. The third active layer 144 may be formed of a semiconductor material such as an oxide semiconductor, amorphous silicon, or polysilicon, but is not limited thereto.

In each of the plurality of sub pixels SP, the third gate electrode 141 is disposed on the gate insulating layer 112 so as to overlap the third active layer 144. The third gate electrode 141 is electrically connected to the sensing line SL. The third gate electrode 141 is integrally formed with the sensing line SL to be formed of the same material as the sensing line SL. The third gate electrode 141 may be configured by a conductive material such as copper (Cu), aluminum (Al), molybdenum (Mo), nickel (Ni), titanium (Ti), chrome (Cr), or an alloy thereof, but is not limited thereto.

The sensing line SL transmits a sensing signal to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the reference line RL extending in the column direction.

The third drain electrode 143 is disposed on the gate insulating layer 112 in each of the plurality of sub pixels SP. The third drain electrode 143 may be electrically connected to the third active layer 144 through a contact hole formed in the gate insulating layer 112. The third drain electrode 143 may be configured by a conductive material such as copper (Cu), aluminum (Al), molybdenum (Mo), nickel (Ni), titanium (Ti), chrome (Cr), or an alloy thereof, but is not limited thereto.

The third drain electrode 143 is electrically connected to the reference line RL through an auxiliary reference line SRL. The plurality of sub pixels SP which forms one pixel may share one reference line RL. In this case, the auxiliary reference line SRL transmits the reference signal from the reference line RL to each of the plurality of sub pixels SP. The auxiliary reference line SRL is electrically connected to the reference line RL and extends in the row direction. The auxiliary reference line SRL is electrically connected to the reference line RL extending in the column direction between the white sub pixel SPW and the blue sub pixel SPB through the contact holes formed in the buffer layer 111 and the gate insulating layer 112. Further, the auxiliary reference line SRL extends in the row direction from the reference line RL to be electrically connected to the third drain electrode 143 of each of the plurality of sub pixels SP. The auxiliary reference line SRL is integrally formed with the third drain electrode 143 to be formed of the same material. The auxiliary reference line SRL may be configured by a conductive material such as copper (Cu), aluminum (Al), molybdenum (Mo), nickel (Ni), titanium (Ti), chrome (Cr), or an alloy thereof, but is not limited thereto.

The storage capacitor 150a is disposed in the circuit area CA of each of the red sub pixel SPR, the blue sub pixel SPB, and the green sub pixel SPG. The storage capacitor 150a may store a voltage between the first gate electrode 121a and the first source electrode 122a of the first transistor 120a to allow the light emitting diode 160 to continuously maintain a constant state for one frame. The storage capacitor 150a includes a first capacitor electrode 151a and a second capacitor electrode 152a.

In each of the red sub pixel SPR, the blue sub pixel SPB, and the green sub pixel SPG, the first capacitor electrode 151a is disposed between the substrate 110 and the buffer layer 111. The first capacitor electrode 151a may be disposed to be the closest to the substrate 110 among the conductive components disposed on the substrate 110. Accordingly, a distance between the first capacitor electrode 151a and the second electrode 165 is increased so that a parasitic capacitance which may be generated between the first capacitor electrode 151a and the second electrode 165 may be minimized.

The first capacitor electrode 151a may be integrally formed with the second source electrode 132 to be electrically connected to the second source electrode 132. Further, the first capacitor electrode 151a may be electrically connected to the first gate electrode 121a through a contact hole formed in the buffer layer 111. That is, the second source electrode 132 of the second transistor 130 and the first gate electrode 121a of the first transistor 120a may be electrically connected to each other through the first capacitor electrode 151a. The first capacitor electrode 151a which is integrally formed with the second source electrode 132 is formed of the same material as the second source electrode 132. For example, the first capacitor electrode 151a may be configured by a conductive material such as copper (Cu), aluminum (Al), molybdenum (Mo), nickel (Ni), titanium (Ti), chrome (Cr), or an alloy thereof, but it is not limited thereto.

In this case, the first capacitor electrode 151a is disposed below the first gate electrode 121a and the first source electrode 122a. The first capacitor electrode 151a is disposed to overlap the first source electrode 122a.

In each of the red sub pixel SPR, the blue sub pixel SPB, and the green sub pixel SPG, the second capacitor electrode 152a is disposed on the gate insulating layer 112. The second capacitor electrode 152a may be disposed on the first capacitor electrode 151a so as to overlap the first capacitor electrode 151a. In this case, two insulating layers, that is, the buffer layer 111 and the gate insulating layer 112 may be disposed between the second capacitor electrode 152a and the first capacitor electrode 151a.

The second capacitor electrode 152a may suppress the light leakage in the circuit areas CA of the red sub pixel SPR, the blue sub pixel SPB, and the green sub pixel SPG. Specifically, in the emission areas EA of the red sub pixel SPR, the blue sub pixel SPB, and the green sub pixel SPG, color filters 171 and 172 corresponding to the corresponding pixel are disposed to convert white light emitted from the light emitting diode 160 into red light, blue light, or green light. When unintended light is emitted from the circuit areas CA of the red sub pixel SPR, the blue sub pixel SPB, and the green sub pixel SPG, light emitted from the emission area EA and light of the circuit area CA are mixed so that a color coordinate of each sub pixel SP may be distorted. In this case, the second capacitor electrode 152a may be formed of a conductive material which is not transparent to be disposed below the light emitting diode 160. Accordingly, even though unintended light is emitted from the circuit area CA of the red sub pixel SPR, the blue sub pixel SPB, and the green sub pixel SPG, the light emitted from the circuit area CA may be suppressed from passing through the substrate 110 by the second capacitor electrode 152a. Therefore, the light leakage in the circuit area CA is suppressed and a color purity in each sub pixel SP may be improved.

The second capacitor electrode 152a may be integrally formed with the first source electrode 122a to be electrically connected to the first source electrode 122a. A part of the first source electrode 122a which overlaps the first capacitor electrode 151a may be defined as a second capacitor electrode 152a. The second capacitor electrode 152a which is integrally formed with the first source electrode 122a is formed of the same material as the first source electrode 122a. For example, the second capacitor electrode 152a may be configured by a conductive material such as copper (Cu), aluminum (Al), molybdenum (Mo), nickel (Ni), titanium (Ti), chrome (Cr), or an alloy thereof, but it is not limited thereto.

In summary, the first capacitor electrode 151a of the storage capacitor 150a is integrally formed with the second source electrode 132 to be electrically connected to the first gate electrode 121a of the first transistor 120a and the second source electrode 132 of the second transistor 130. Further, the second capacitor electrode 152a is integrally formed with the first source electrode 122a to be electrically connected to the first source electrode 122a of the first transistor 120a and the third source electrode 142 of the third transistor 140.

Next, the passivation layer 113 is disposed on the first transistor 120, the second transistor 130, the third transistor 140, the storage capacitor 150, the plurality of high potential power lines VDD, the plurality of data lines DL, the reference line RL, the gate line GL, and the sensing line SL. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the exemplary aspect.

A plurality of color filters is disposed on the passivation layer 113. Specifically, the plurality of color filters may be disposed between the planarization layer 114 and the passivation layer 113. The plurality of color filters includes a first color filter 171, a second color filter 172, and a third color filter. For example, the first color filter 171 is a red color filter, the second color filter 172 is a blue color filter, and the third color filter may be a green color filter.

The first color filter 171 may be disposed between the substrate 110 and the planarization layer 114 in the emission area EA of one sub pixel SP among the plurality of sub pixels SP. The first color filter 171 may be disposed between the first transistor 120 and the planarization layer 114 in the circuit area CA of one sub pixel SP among the plurality of sub pixels SP. For example, the first color filter 171 may be a red color filter. The first color filter 171 is disposed between the substrate 110 and the planarization layer 114 in the emission area EA of the red sub pixel SPR and disposed between the planarization layer 114 and the first transistor 120a in the circuit area CA of the red sub pixel SPR. The first color filter 171 may be disposed between the substrate 110 and the planarization layer 114 in the circuit area CA of each of the white sub pixel SPW, the blue sub pixel SPB, and the green sub pixel SPG in addition to the red sub pixel SPR. Therefore, the first color filter 171 disposed in the emission area EA of the red sub pixel SPR and in the circuit area CA of each of the plurality of sub pixels SP may be formed in a mesh shape.

The second color filter 172 may be disposed between the substrate 110 and the planarization layer 114 in the emission area EA of the other one sub pixel SP among the plurality of sub pixels SP. The second color filter 172 is disposed between the first transistor 120a and the planarization layer 114 in the circuit area CA of the other one sub pixel SP among the plurality of sub pixels SP and disposed between the first color filter 171 and the planarization layer 114 in the circuit area CA of one sub pixel SP. For example, the second color filter 172 is a blue color filter. The second color filter 172 is disposed between the substrate 110 and the planarization layer 114 in the emission area EA of the blue sub pixel SPB and is disposed between the planarization layer 114 and the first transistor 120a in the circuit area CA of the blue sub pixel SPB. Further, the second color filter 172 may be disposed between the first color filter 171 and the planarization layer 114 in the circuit area CA of the red sub pixel SPR. The second color filter 172 may be disposed between the substrate 110 and the planarization layer 114 in each circuit area CA of each of the white sub pixel SPW and the green sub pixel SPG in addition to the circuit areas CA of the blue sub pixel SPB and the red sub pixel SPR. Therefore, the second color filter 172 disposed in the emission area EA of the blue sub pixel SPB and in the circuit area CA of each of the plurality of sub pixels may be formed in a mesh shape.

Further, the first color filter 171 and the second color filter 172 disposed in the circuit area CA of each of the plurality of sub pixels SP may partially overlap. In the circuit area CA of each of the plurality of sub pixels SP, the first color filter 171 is disposed between the substrate 110 and the planarization layer 114 and the second color filter 172 is disposed between the first color filter 171 and the planarization layer 114. Therefore, the first color filter 171 and the second color filter 172 may overlap in the circuit area CA of each of the plurality of sub pixels SP.

In the meantime, even though it is described that the first color filter 171 and the second color filter 172 overlap in the circuit area CA of each of the plurality of sub pixels SP, it is just a configuration in accordance with a process order, but the type of the plurality of color filters laminated in the circuit area CA is not limited thereto. For example, when the third color filter and the first color filter 171 are sequentially formed on the passivation layer 113, the third color filter and the first color filter 171 may be laminated in the entire circuit area CA of each of the plurality of sub pixels SP.

The third color filter is disposed in the emission area EA of the other one sub pixel SP among the plurality of sub pixels SP. For example, the third color filter is a green color filter and may be disposed between the substrate 110 and the planarization layer 114 in the emission area EA of the green sub pixel SPG. In this case, in the circuit area CA of the green sub pixel SPG, instead of the third color filter, the first color filter 171 and the second color filter 172 may be disposed. Accordingly, since the third color filter is disposed only in the emission area EA of the green sub pixel SPG, the third color filter may be formed to have an island shape. However, the present disclosure is not limited thereto and the first color filter 171 or the second color filter 172 is disposed only in the emission area EA to be formed to have an island shape. In this case, in the circuit area CA of each of the plurality of sub pixels SP, the third color filter may be disposed to overlap the first color filter 171 or the second color filter 172.

In the meantime, the color filters 171 and 172 are not disposed in the emission area EA of the white sub pixel SPW, but are disposed only in the circuit area CA. Specifically, the light emitting diode 160 emits white light so that a color filter for converting light emitted from the light emitting diode 160 is not required for the white sub pixel SPW. Therefore, a separate color filter is not disposed in the emission area EA of the white sub pixel SPW.

At least some of the plurality of color filters is laminated in the circuit area CA so that the parasitic capacitance between the first capacitor electrode 151a and the second electrode 165 may be minimized. Specifically, the plurality of color filters may be disposed between the light emitting diode 160 and the substrate 110 to convert light emitted from the light emitting diode 160 into various colors. In this case, each of the plurality of color filters is disposed not only in the emission area EA, but also in the circuit area CA to increase a distance between the first capacitor electrode 151a and the second electrode 165 in the circuit area CA. For example, the first color filter 171 and the second color filter 172 may be disposed between the first capacitor electrode 151a and the second electrode 165 in the circuit area CA. Accordingly, a distance between the first capacitor electrode 151a and the second electrode 165 is increased and a data signal distortion due to a parasitic capacitance which may be generated between the first capacitor electrode 151a and the second electrode 165 may be minimized.

The planarization layer 114 is disposed on the passivation layer 113 and the color filters 171 and 172. The planarization layer 114 is an insulating layer which planarizes an upper portion of the substrate 110 on which the first transistor 120, the second transistor 130, the third transistor 140, the storage capacitor 150, the plurality of high potential power lines VDD, the plurality of data lines DL, the reference line RL, the gate line GL, and the sensing line SL are disposed. The planarization layer 114 may be formed of an organic material, and for example, may be configured by a single layer or a double layer of polyimide or photo acryl, but is not limited thereto.

The light emitting diode 160 is disposed in each of the plurality of sub pixels SP. The light emitting diode 160 is disposed on the planarization layer 114 in each of the plurality of sub pixels SP. The light emitting diode 160 includes a first electrode 161, a light emitting layer 164, and a second electrode 165.

The first electrode 161 is disposed on the planarization layer 114 in the emission area EA. The first electrode 161 supplies holes to the light emitting layer 164 so that the first electrode 161 may be formed of a conductive material having a high work function and may be referred to as an anode. For example, the first electrode 161 may be formed of a transparent conductive material such as indium tin oxide (ITO) and indium zinc oxide (IZO), but is not limited thereto.

In the meantime, when the display device 100 according to the exemplary aspect of the present disclosure is a top emission type, a reflective layer which is formed of metal material having an excellent reflection efficiency, such as aluminum (Al) or silver (Ag) may be added below the first electrode 161. Therefore, the light emitted from the light emitting layer 164 is reflected to the first electrode 161 to be upwardly directed, that is, to be directed to the second electrode 165. In contrast, when the display device 100 is a bottom emission type, the first electrode 161 may be only formed of a transparent conductive material. Hereinafter, the description will be made under the assumption that the display device 100 according to the exemplary aspect of the present disclosure is a bottom emission type.

In the emission area EA and the circuit area CA, the light emitting layer 164 is disposed on the first electrode 161. The light emitting layer 164 may be formed as one layer over the plurality of sub pixels SP. That is, the light emitting layers 164 of the plurality of sub pixels SP are connected to be integrally formed. The light emitting layer 164 may be configured as one light emitting layer 164 or may have a structure in which a plurality of light emitting layers 164 emitting different color light is laminated. The light emitting layer 164 may further include an organic layer such as a hole injection layer, a hole transport layer, an electron transport layer, and an electron injection layer.

In the emission area EA and the circuit area CA, the second electrode 165 is disposed on the light emitting layer 164. The second electrode 165 supplies electrons to the light emitting layer 164 so that the second electrode may be formed of a conductive material having a low work function and may be referred to as a cathode. The second electrode 165 may be formed as one layer over the plurality of sub pixels SP. That is, the second electrodes 165 of the plurality of sub pixels SP are connected to be integrally formed. For example, the second electrode 165 may be formed of a transparent conductive material such as indium tin oxide (ITO) and indium zinc oxide (IZO) or ytterbium (Yb) alloy and may further include a metal doping layer, but is not limited thereto. Even though not illustrated in FIGS. 3 and 4, the second electrode 165 of the light emitting diode 160 may be electrically connected to the low potential power line VSS to be supplied with a low potential power signal.

The light emitting diode 160 includes an extension portion 162 extending from the first electrode 161 to the circuit area CA. The extension portion 162 extends from the first electrode 161 of the emission area EA to the first source electrodes 122a and 122b of the circuit area CA to be electrically connected to the first source electrodes 122a and 122b through contact holes formed in the planarization layer 114 and the passivation layer 113. Accordingly, the first electrode 161 of the light emitting diode 160 may be electrically connected to the first source electrodes 122a and 122b of the first transistor 120 and the second capacitor electrodes 152a and 152b of the storage capacitor 150 through the extension portion 162.

The display device 100 according to the exemplary aspect of the present disclosure disposes the extension portion 162 to reduce the power consumption of the light emitting diode 160 and minimize distortion of the color coordinate. First, the light emitting layer 164 and the second electrode 165 are disposed in the entire emission area EA and circuit area CA. The light emitting layer 164 is disposed in the entire emission area EA and circuit area CA, but the light is not emitted from the entire light emitting layer 164, but is emitted only from a part of the light emitting layer 164 which overlaps both the second electrode 165 and the first electrode 161. In this case, when the first electrode 161 is disposed in the entire circuit area CA, the light is emitted even from the circuit area CA and the power consumption and a quantity of light of the light emitting diode 160 may be increased. However, since the display device 100 according to the exemplary aspect of the present disclosure is a bottom emission type, even though the light is emitted from the circuit area CA, the light is blocked by the plurality of transistors and the storage capacitor 150 of the circuit area CA. Therefore, a light extraction efficiency is lowered. Further, when the image is implemented using light emitted from the emission area EA, unintended light is emitted from the circuit area CA so that the color coordinate may be distorted due to the light leakage. Therefore, in the circuit area CA, only the extension portion 162 which is electrically connected to the first electrode 161 is disposed at the least, so that the light emission in the circuit area CA is minimized and the power consumption and the distortion of the color coordinate of the light emitting diode 160 may be reduced.

The light emitting diode 160 includes a repair unit 163 extending from the first electrode 161 to the circuit area CA of an adjacent sub pixel SP. The repair unit 163 extends to the circuit area CA of a sub pixel SP which emits the light having the same color, among adjacent sub pixels SP. For example, the repair unit 163 of one red sub pixel SPR may extend toward the circuit area CA of the other red sub pixel SPR which is adjacent to one red sub pixel SPR in a vertical direction. The repair unit 163 may extend toward the third source electrode 142 of the third transistor 140 of the circuit area CA of the adjacent sub pixel SP. The repair unit 163 may overlap the third source electrode 142 with the planarization layer 114 and the passivation layer 113 therebetween.

If defects occur in the plurality of transistors and the storage capacitor 150 of the circuit area CA, laser is irradiated onto the repair unit 163 extending toward the third source electrode 142 of the adjacent sub pixel SP to electrically connect the repair unit 163 to the third source electrode 142 of the adjacent sub pixel SP. At this time, the third source electrode 142 is electrically connected between the first source electrode 122a and 122b of the first transistor 120 and the first electrode 161 of the light emitting diode 160, that is, at a point where current which is supplied to the light emitting diode 160 from the first transistor 120 flows. Therefore, even though defects occur in the driving circuit, the first transistor 120 and the repair unit 163 may be electrically connected by the third source electrode 142 of the adjacent sub pixel SP and two light emitting diodes 160 may be driven by one driving circuit. In the meantime, even though in the drawing, it is illustrated that the repair unit 163 overlaps the third source electrode 142, the repair unit 163 may overlap the first transistor 120, but is not limited thereto.

A repair pattern RP is disposed between the repair unit 163 and the third source electrode 142. The repair pattern RP may be formed of the same material as the first gate electrode 121a and the gate line GL on the same layer. The repair pattern RP having an island shape is disposed to overlap the third source electrode 142 and the repair unit 163. When a defect occurs in the driving circuit, the laser is irradiated onto the repair unit 163 to electrically connect the repair unit 163, the repair pattern RP, and the third source electrode 142 to each other. In this case, a plurality insulating layers such as the buffer layer 111, the gate insulating layer 112, the passivation layer 113, and the planarization layer 114 is disposed between the third source electrode 142 and the repair unit 163. Further, the repair pattern RP is further disposed between the third source electrode 142 and the repair unit 163 to easily connect the third source electrode 142 and the repair unit 163. However, the repair unit 163 and the repair pattern RP may be omitted depending on a design, but is not limited thereto.

In the meantime, a dummy pattern DP formed of the same material as the gate line GL is disposed on some contact holes of the plurality of contact holes, the high potential power lines VDD, and the reference line RL. The dummy pattern DP having an island shape may be disposed so as to overlap the high potential power line VDD, the reference line RL, or the contact hole. The dummy pattern DP is a pattern for the design of a mask so that the arrangement of the dummy pattern DP may vary depending on the mask design, but is not limited thereto.

Hereinafter, the white sub pixel SPW will be described in more detail with reference to FIGS. 3 and 5.

Figure 5:
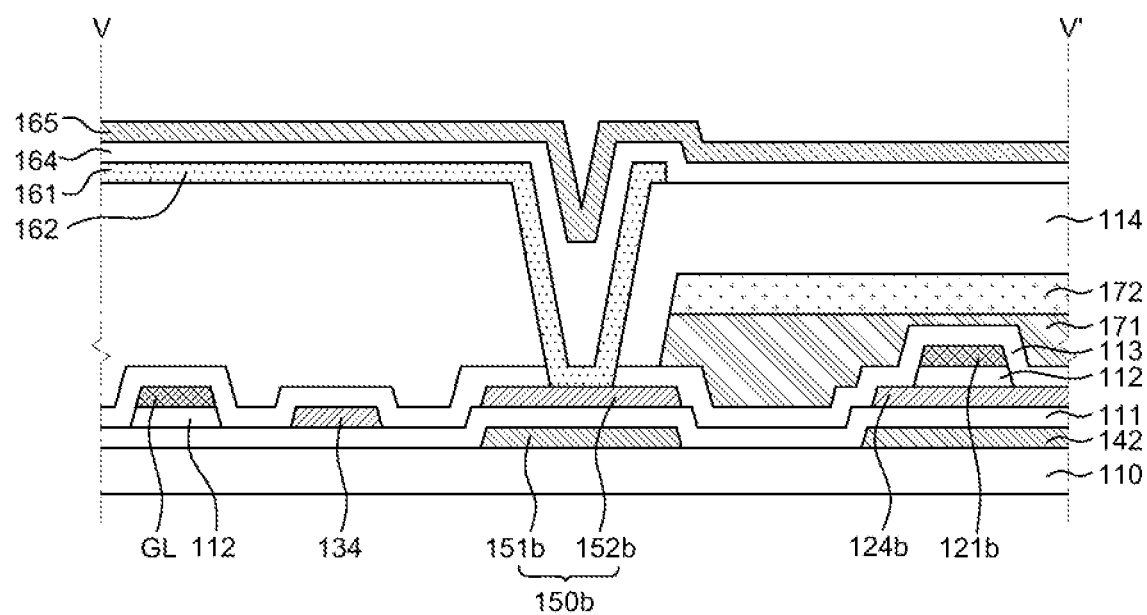
FIG. 5 is a cross-sectional view taken along line V-V of FIG. 3.

FIG. 5 is a cross-sectional view taken along line V-V' of FIG. 3.

Referring to FIGS. 3 and 5, the first transistor 120b, the second transistor 130, the third transistor 140, and the storage capacitor 150b are disposed in the circuit area CA of the white sub pixel SPW. The structures of the second transistor 130 and the third transistor 140 are substantially the same as the above-described structure of the red sub pixel SPR so that a redundant description will be omitted.

The first transistor 120b of the white sub pixel SPW includes a first gate electrode 121b, a first source electrode 122b, a first drain electrode 123b, and a first active layer 124b. The first transistor 120b which is electrically connected to the first electrode 161 of light emitting diode 160 and the high potential power line VDD may be a driving transistor.

First, the first drain electrode 123b is disposed on the buffer layer 111. The first drain electrode 123b of the white sub pixel SPW may be integrally formed with the first drain electrode 123a of the red sub pixel SPR. That is, the first drain electrode 123b of the white sub pixel SPW and the first drain electrode 123a of the red sub pixel SPR may be integrally formed to share one first high potential power line VDD1. Accordingly, the first drain electrode 123b may be electrically connected to the first high potential power line VDD1 through a contact hole formed on the buffer layer 111.

The first active layer 124b of the white sub pixel SPW is disposed on the buffer layer 111. The first active layer 124b may be integrally formed with the first drain electrode 123b. That is, when a voltage is applied to the first gate electrode 121b of the white sub pixel SPW, the first drain electrode 123b which is integrally formed with the first active layer 124b and formed of a material contained in the first active layer 124a which becomes conductive may transmit the power signal from the first high potential power line VDD1 to the first active layer 124b and the first source electrode 122b. Further, the first active layer 124b which is not a conductive area may serve as a channel of the first transistor 120b.

The first gate electrode 121b of the white sub pixel SPW is disposed on the gate insulating layer 112 so as to overlap the first active layer 124b. The first gate electrode 121b of the white sub pixel SPW is disposed on the same layer as the first gate electrode 121a of the red sub pixel SPR, the blue sub pixel SPB, and the green sub pixel SPG to be formed of the same material, but is not limited thereto.

The first source electrode 122b of the white sub pixel SPW is disposed on the gate insulating layer 112 to be spaced apart from the first gate electrode 121b. The first source electrode 122b may be electrically connected to the first active layer 124b through a contact hole formed on the gate insulating layer 112. The first source electrode 122b is disposed on the same layer as the first gate electrode 121b to be formed of the same material, but is not limited thereto. For example, the first source electrode 122b is integrally formed with the first active layer 124b to connect the first active layer 124b and the second capacitor electrode 152b. In this case, the first source electrode 122b extends from the first active layer 124b so that the material contained in the first active layer 124b becomes conductive. The second capacitor electrode 152b extends from the first source electrode 122b so that the material contained in the first active layer 124b becomes conductive.

The storage capacitor 150b of the white sub pixel SPW may store a voltage between the first gate electrode 121b and the first source electrode 122b of the first transistor 120b to allow the light emitting diode 160 to continuously maintain a constant state for one frame. The storage capacitor 150b includes a first capacitor electrode 151b and a second capacitor electrode 152b.

The first capacitor electrode 151b of the white sub pixel SPW is disposed between the substrate 110 and the buffer layer 111. The first capacitor electrode 151b of the white sub pixel SPW may be disposed on the same layer as the first capacitor electrode 151a of the red sub pixel SPR and formed of the same material, but is not limited thereto. The first capacitor electrode 151b is disposed below the first gate electrode 121b and the first source electrode 122b. Specifically, the first capacitor electrode 151b may be disposed to be the closest to the substrate 110 among the conductive components disposed on the substrate 110. Accordingly, a distance between the first capacitor electrode 151b and the second electrode 165 is increased so that a parasitic capacitance which may be generated between the first capacitor electrode 151b and the second electrode 165 may be minimized.

The first capacitor electrode 151b may be integrally formed with the second source electrode 132 to be electrically connected to the second source electrode 132. Further, the first capacitor electrode 151b may be electrically connected to the first gate electrode 121b through a contact hole formed in the buffer layer 111. That is, the second source electrode 132 of the second transistor 130 and the first gate electrode 121b of the first transistor 120b may be electrically connected to each other through the first capacitor electrode 151b.

The second capacitor electrode 152b of the white sub pixel SPW is disposed on the buffer layer 111. The second capacitor electrode 152b is disposed on the same layer as the first active layer 124b so that the material contained in the first active layer 124b becomes conductive. The second capacitor electrode 152b may be disposed on the first capacitor electrode 151b so as to overlap the first capacitor electrode 151b. In this case, only one insulating layer, that is, the buffer layer 111 is disposed between the second capacitor electrode 152b and the first capacitor electrode 151b.

The second capacitor electrode 152b may be electrically connected to the first source electrode 122b through a contact hole formed in the gate insulating layer 112. Alternatively, the second capacitor electrode 152b may be integrally formed with the first source electrode 122b to be electrically connected to the first source electrode 122b. When the second capacitor electrode 152b and the first source electrode 122b are integrally formed, the second capacitor electrode 152b may be defined as an area which overlaps the first capacitor electrode 151b of the first source electrode 122b. The second capacitor electrode 152b may be electrically connected to the third source electrode 142 of the third transistor 140 through the first source electrode 122b.

In the display device 100 according to the exemplary aspect of the present disclosure, the number of insulating layers between the first capacitor electrode 151b and the second capacitor electrode 152b of the white sub pixel SPW may be smaller than the number of insulating layers between the first capacitor electrode 151a and the second capacitor electrode 152a of the red sub pixel SPR, the blue sub pixel SPB, and the green sub pixel SPG. Specifically, only the buffer layer 111 may be disposed between the first capacitor electrode 151b and the second capacitor electrode 152b of the white sub pixel SPW. Further, the buffer layer 111 and the gate insulating layer 112 may be disposed between the first capacitor electrode 151a and the second capacitor electrode 152a of the red sub pixel SPR, the blue sub pixel SPB, and the green sub pixel SPG. That is, one insulating layer may be disposed between the first capacitor electrode 151b and the second capacitor electrode 152b of the white sub pixel SPW. Two insulating layers may be disposed between the first capacitor electrode 151a and the second capacitor electrode 152a of the red sub pixel SPR, the blue sub pixel SPB, and the green sub pixel SPG.

In other words, the gate insulating layer 112 is disposed between the first capacitor electrode 151a and the second capacitor electrode 152a of the red sub pixel SPR, the blue sub pixel SPB, and the green sub pixel SPG. However, the gate insulating layer 112 may be omitted between the first capacitor electrode 151b and the second capacitor electrode 152b of the white sub pixel SPW. Therefore, a distance between the first capacitor electrode 151b and the second capacitor electrode 152b of the white sub pixel SPW is smaller than a distance between the first capacitor electrode 151a and the second capacitor electrode 152a of the red sub pixel SPR, the blue sub pixel SPB, and the green sub pixel SPG.

Therefore, an area of the first capacitor electrode 151b and the second capacitor electrode 152b of the white sub pixel SPW may be reduced. Specifically, a capacitance required for the corresponding sub pixel SP may be present in each of the plurality of sub pixels SP. In this case, the distance between the first capacitor electrode 151b and the second capacitor electrode 152b of the white sub pixel SPW is reduced so that the capacitance required for the white sub pixel SPW is maintained and the area of the first capacitor electrode 151b and the second capacitor electrode 152b may be reduced. Therefore, the area of the first capacitor electrode 151b and the second capacitor electrode 152b of the white sub pixel SPW may be smaller than an area of the first capacitor electrode 151a and the second capacitor electrode 152a of the red sub pixel SPR, the blue sub pixel SPB, and the green sub pixel SPG. The display device 100 according to the exemplary aspect of the present disclosure has a structure in which a bank is omitted so that the light may be emitted from all the areas where the first electrode 161 is disposed. That is, not only in the emission area EA, but also in an area of the circuit area CA where the extension portion 162 is disposed, the light may be emitted. Therefore, the area of the first capacitor electrode 151b and the second capacitor electrode 152b of the white sub pixel SPW is reduced so that the area where the light is emitted may be increased as much as the reduced area of the first capacitor electrode 151b and the second capacitor electrode 152b. Therefore, an aperture ratio at which the light is discharged from the white sub pixel SPW is increased so that the luminance may be improved.

Further, the first capacitor electrode 151b of the white sub pixel SPW includes a metal material and the second capacitor electrode 152b may be an area where a semiconductor material which is contained in the first active layer 124b becomes conductive. In contrast, all the first capacitor electrode 151a and the second capacitor electrode 152a of the red sub pixel SPR, the blue sub pixel SPB, and the green sub pixel SPG may include a metal material. That is, in the white sub pixel SPW, one metal layer is disposed below the extension portion 162 corresponding to the storage capacitor 150b and in the red sub pixel SPR, the blue sub pixel SPB, and the green sub pixel SPG, two metal layers may be disposed below the extension portion 162 corresponding to the storage capacitor 150b. The number of metal layers disposed below the extension portion 162 of the white sub pixel SPW is reduced so that the emitted light blocking due to the metal layer is suppressed and the aperture ratio may be more increased.

In a general display device, storage capacitors having the same cross-sectional structure are applied to all the plurality of sub pixels for the convenience of design. Specifically, in each of the sub pixel, the first capacitor electrode is disposed on the same layer as a light shielding layer and the second capacitor electrode is disposed on the same layer as the gate electrode. Therefore, the light which is incident onto the circuit unit of each sub pixel is blocked by the first capacitor electrode and the second capacitor electrode and light leakage due to unintended light generated in the circuit unit is suppressed. In this case, the first capacitor electrode is disposed between the substrate and the buffer layer and the second capacitor electrode is disposed between the gate insulating layer and the passivation layer on the buffer layer. Therefore, two insulating layers, that is, the buffer layer and the gate insulating layer are disposed between the first capacitor electrode and the second capacitor electrode. Therefore, in order to allow the storage capacitor to have sufficient capacitance, an area of the first capacitor electrode and the second capacitor electrode needs to be maintained to be a predetermined level or higher.

In the display device 100 according to the exemplary aspect of the present disclosure, the structure of the storage capacitor 150a of the red sub pixel SPR, the blue sub pixel SPB, and the green sub pixel SPG is configured to be different from the structure of the storage capacitor 150b of the white sub pixel SPW. Therefore, the aperture ratio of the white sub pixel SPW is increased and the luminance is improved.

Specifically, since the light emitting diode 160 is a white light emitting diode, even though the light leakage is generated in the circuit area CA of the white sub pixel SPW, which may contribute to improvement of the aperture ratio and the luminance of the white sub pixel SPW. That is, the white sub pixel SPW does not require a separate light leakage suppressing structure so that the second capacitor electrode 152b may not be formed of the same metal layer on the same layer as the second capacitor electrode 152a of the red sub pixel SPR, the blue sub pixel SPB, and the green sub pixel SPG.

Therefore, the second capacitor electrode 152b of the white sub pixel SPW is formed on the same layer as the first active layer 124b so that the material contained in the first active layer 124b becomes conductive. That is, the gate insulating layer 112 is omitted between the first capacitor electrode 151b and the second capacitor electrode 152b of the white sub pixel SPW and the buffer layer 111 which is one insulating layer is disposed. Accordingly, since the distance between the first capacitor electrode 151b and the second capacitor electrode 152b is reduced, the capacitance of the storage capacitor 150b is maintained and the areas of the first capacitor electrode 151b and the second capacitor electrode 152b may be reduced. As much as the area of the storage capacitor 150b of the white sub pixel SPW is reduced, the aperture ratio may be increased so that the luminance of the white sub pixel SPW may be improved.

In other words, in the red sub pixel SPR, the blue sub pixel SPB, and the green sub pixel SPG, the second capacitor electrode 152a and the first gate electrode 121a may be disposed on the same layer to suppress the light leakage of the circuit area CA. Therefore, two insulating layers may be disposed between the first capacitor electrode 151a and the second capacitor electrode 152a. In contrast, in the case of the white sub pixel SPW, the light leakage may contribute to improvement of the luminance so that the second capacitor electrode 152b and the first active layer 124b may be disposed on the same layer. Accordingly, one insulating layer is disposed between the first capacitor electrode 151b and the second capacitor electrode 152b and a distance therebetween may be relatively close. Therefore, the area of the storage capacitor 150b of the white sub pixel SPW may be reduced. Further, the second capacitor electrode 152b of the white sub pixel SPW is formed by a semiconductor material contained in the first active layer 124b which becomes conductive so that only the first capacitor electrode 152a of the storage capacitor 150b may be formed of a metal layer. Therefore, the blocking of light emitted from the circuit area CA due to the metal layer of the storage capacitor 150b of the white sub pixel SPW may be minimized. Accordingly, the aperture ratio and the luminance of the white sub pixel SPW are improved so that the luminous efficiency of the display device 100 may be improved.

Figure 6:
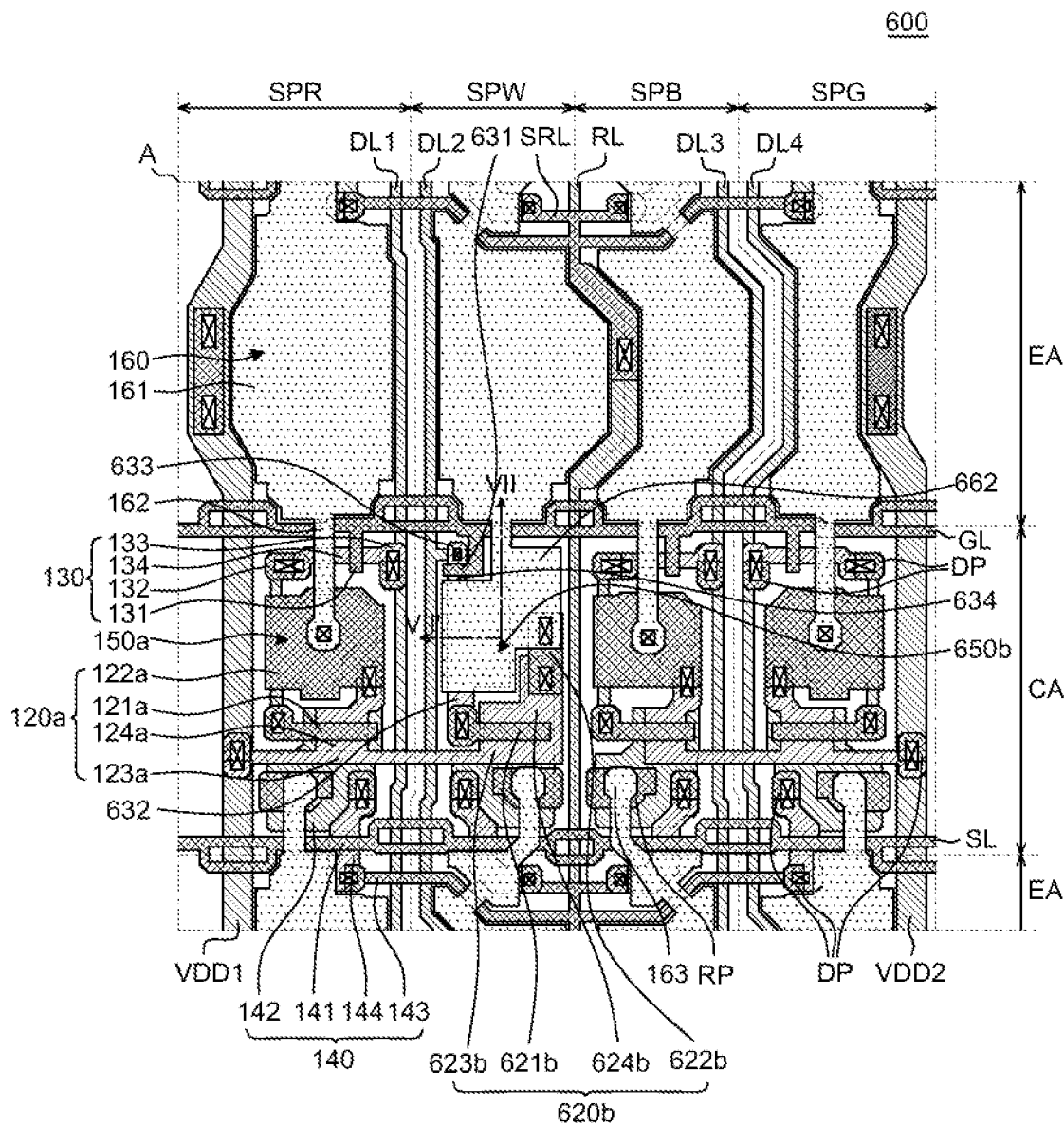
FIG. 6 is an enlarged plan view of a display device according to another exemplary aspect of the present disclosure.
Figure 7:
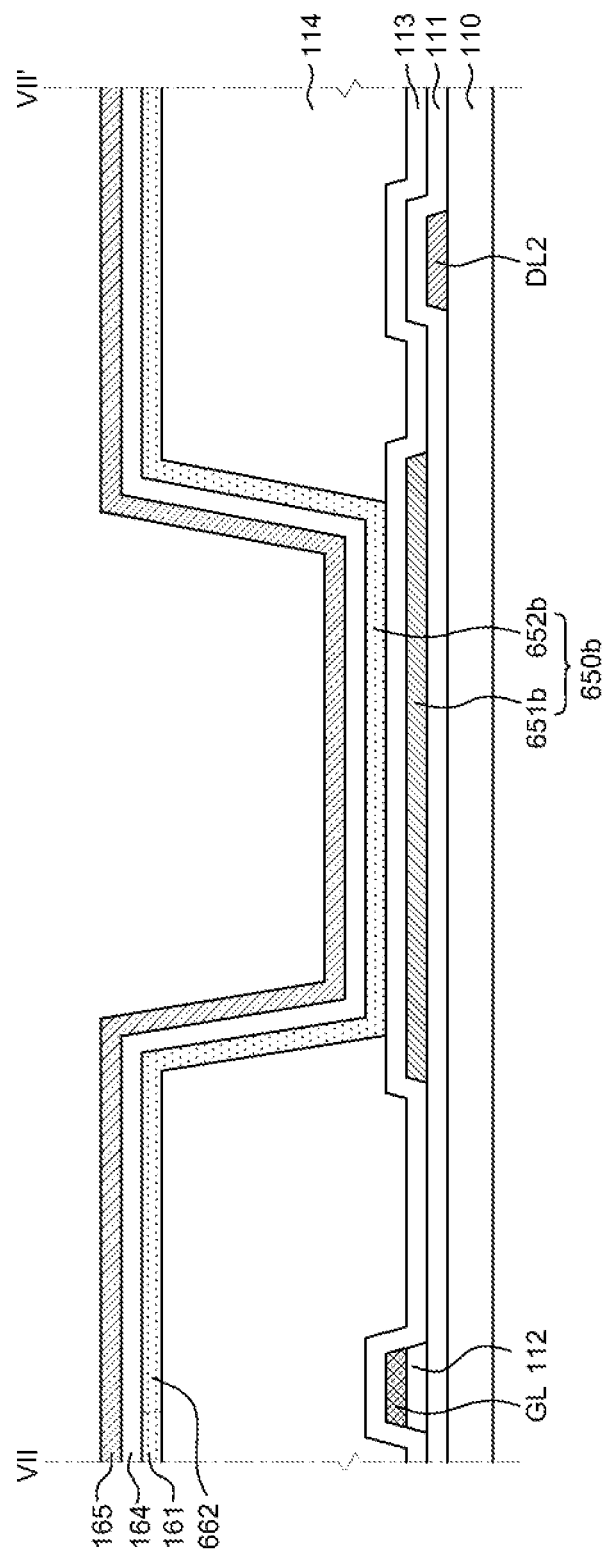
FIG. 7 is a cross-sectional view taken along line VII-VII' of FIG. 6.

FIG. 6 is an enlarged plan view of a display device according to another exemplary aspect of the present disclosure. FIG. 7 is a cross-sectional view taken along line VII-VII' of FIG. 6. A display device 600 of FIGS. 6 and 7 has different structures of a first transistor 620b, a second transistor 630, a storage capacitor 650b, and an extension portion 662 of a white sub pixel SPW from the display device 100 of FIGS. 1 to 5, but other configurations are substantially the same. Therefore, a redundant description will be omitted.

Referring to FIGS. 6 and 7, the first transistor 620b, the second transistor 630, the third transistor 140, the storage capacitor 650b, and the extension portion 662 are disposed in the circuit area CA of the white sub pixel SPW.

The first transistor 620b of the white sub pixel SPW includes a first gate electrode 621b, a first source electrode 622b, a first drain electrode 623b, and a first active layer 624b. The first transistor 620b which is electrically connected to the first electrode 161 of light emitting diode 160 and a high potential power line VDD may be a driving transistor.

First, the first drain electrode 623b is disposed on the buffer layer 111. The first drain electrode 623b of the white sub pixel SPW may be integrally formed with the first drain electrode 123a of the red sub pixel SPR. That is, the first drain electrode 623b of the white sub pixel SPW and the first drain electrode 123a of the red sub pixel SPR may be integrally formed to share one first high potential power line VDD1. Accordingly, the first drain electrode 623b may be electrically connected to the first high potential power line VDD1 through a contact hole formed on the buffer layer 111.

The first active layer 624b of the white sub pixel SPW is disposed on the buffer layer 111. The first active layer 624b may be integrally formed with the first drain electrode 623b. That is, when a voltage is applied to the first gate electrode 621b of the white sub pixel SPW, the first drain electrode 623b which is integrally formed with the first active layer 624b so that a material contained in the first active layer 624b becomes conductive may transmit the power signal from the first high potential power line VDD1 to the first active layer 624b and the first source electrode 622b. Further, the first active layer 624b which is not a conductive area may serve as a channel of the first transistor 620b.

The first gate electrode 621b of the white sub pixel SPW is disposed on the gate insulating layer 112 so as to overlap the first active layer 624b. The first gate electrode 621b of the white sub pixel SPW is disposed on the same layer as the first gate electrode 121a of the red sub pixel SPR, the blue sub pixel SPB, and the green sub pixel SPG to be formed of the same material, but is not limited thereto.

The first source electrode 622b of the white sub pixel SPW is disposed on the gate insulating layer 112 to be spaced apart from the first gate electrode 621b. The first source electrode 622b may be electrically connected to the first active layer 624b through a contact hole formed on the gate insulating layer 112. The first source electrode 622b is disposed on the same layer as the first gate electrode 621b to be formed of the same material, but is not limited thereto. For example, the first source electrode 622b may be integrally formed with the first active layer 624b. In this case, the first source electrode 622b extends from the first active layer 624b so that the material contained in the first active layer 624b becomes conductive.

The second transistor 630 of the white sub pixel SPW includes a second gate electrode 631, a second source electrode 632, a second drain electrode 633, and a second active layer 634. The second transistor 630 which is electrically connected to the gate line GL, the data line DL, and the first gate electrode 621a of the first transistor 620a may be a switching transistor.

First, the second drain electrode 633 is disposed between the substrate 110 and the buffer layer 111. The second drain electrode 633 is electrically connected to one data line DL among the plurality of data lines DL. The second drain electrode 633 is integrally formed with the plurality of data lines DL to be formed of the same material as the plurality of data lines DL. For example, the second drain electrode 633 of the white sub pixel SPW may be integrally formed with the second data line DL2.

The second active layer 634 of the white sub pixel SPW is disposed on the buffer layer 111. The second active layer 634 may be electrically connected to the second drain electrode 633 through a contact hole formed on the buffer layer 111. The second active layer 634 is disposed on the same layer as the first active layer 624b to be formed of the same material, but is not limited thereto.

The second source electrode 632 of the white sub pixel SPW is disposed on the buffer layer 111. The second source electrode 632 may be integrally formed with the second active layer 634. That is, the second source electrode 632 extends from the second active layer 634 so that the material contained in the second active layer 634 becomes conductive. The second source electrode 632 electrically connects the second transistor 630 to the first gate electrode 621a of the first transistor 620a.

The second gate electrode 631 of the white sub pixel SPW is disposed on the gate insulating layer 112 so as to overlap the second active layer 634. The second gate electrode 631 extends from the gate line GL. Therefore, the second gate electrode 631 is integrally formed with the gate line GL to be formed of the same material as the gate line GL.

The storage capacitor 650b of the white sub pixel SPW may store a voltage between the first gate electrode 621b and the first source electrode 622b of the first transistor 620b to allow the light emitting diode 160 to continuously maintain a constant state for one frame. The storage capacitor 650b includes a first capacitor electrode 651b and a second capacitor electrode 652b.

The first capacitor electrode 651b of the white sub pixel SPW is disposed between the buffer layer 111 and the passivation layer 113. The first capacitor electrode 651b may be integrally formed with the second source electrode 632 to be electrically connected to the second source electrode 632. That is, the first capacitor electrode 651b is disposed on the same layer as the first active layer 624b and the second active layer 634 so that materials contained in the first active layer 624b and the second active layer 634 become conductive. The first capacitor electrode 651b may be electrically connected to the first gate electrode 621b through a contact hole formed in the gate insulating layer 112. That is, the second source electrode 632 of the second transistor 630 and the first gate electrode 621b of the first transistor 620b may be electrically connected to each other through the first capacitor electrode 651b.

The second capacitor electrode 652b of the white sub pixel SPW is disposed on the passivation layer 113. The second capacitor electrode 652b is integrally formed with the extension portion 662 extending from the first electrode 161 of the light emitting diode 160 toward the circuit area CA to be electrically connected to the extension portion 662. Therefore, the second capacitor electrode 652b may be formed of the same transparent conductive material as the first electrode 161. In this case, the second capacitor electrode 652b may be defined as an area of the extension portion 662 which overlaps the first capacitor electrode 651b.

In the meantime, a partial area of the extension portion 662 is disposed on the planarization layer 114 which is the same layer as the first electrode 161 and the remaining area may be disposed on the passivation layer 113. In this case, the remaining area of the extension portion 662 disposed on the passivation layer 113 may correspond to the second capacitor electrode 652b. Specifically, the planarization layer 114 may be disposed on the passivation layer 113 to expose a part of the passivation layer 113 which overlaps the first capacitor electrode 651b. That is, the planarization layer 114 is not disposed on the passivation layer 113 which overlaps the first capacitor electrode 651b. Further, the second capacitor electrode 652b extends from the extension portion 662 on the planarization layer 114 to be disposed on the passivation layer 113 which is exposed by the planarization layer 114. Therefore, only one insulating layer, that is, the passivation layer 113 is disposed between the second capacitor electrode 652b and the first capacitor electrode 651b.

The second capacitor electrode 652b may be connected to the extension portion 662 to be electrically connected to the first source electrode 622b through a contact hole formed in the planarization layer 114 and the passivation layer 113. The second capacitor electrode 652b may be electrically connected to the third source electrode 142 of the third transistor 140 through the extension portion 662 and the first source electrode 622b.

The extension portion 662 extends from the first electrode 161 of the emission area EA to the circuit area CA in the white sub pixel SPW. In this case, the light emitting layer 164 and the second electrode 165 of the light emitting diode 160 are disposed in the entire emission area EA and circuit area CA. Therefore, the light emitting layer 164 and the second electrode 165 may be disposed on the extension portion 662. Therefore, in an area of the circuit area CA where the extension portion 662 is disposed, light may be emitted.

The extension portion 662 of the white sub pixel SPW extends from the first electrode 161 to the first source electrode 622b. In this case, a partial area of the extension portion 662 may be disposed on the planarization layer 114, similarly to the first electrode 161. The extension portion 662 may be electrically connected to the first source electrode 622b through a contact hole formed in the planarization layer 114 and the passivation layer 113. Therefore, the first electrode 161 of the light emitting diode 160 may be electrically connected to the first source electrode 622b of the first transistor 620b through the extension portion 662.

The extension portion 662 of the white sub pixel SPW is integrally formed with the second capacitor electrode 652b of the storage capacitor 650b to be electrically connected to the second capacitor electrode 652b. Specifically, a partial area of the extension portion 662 may serve as the second capacitor electrode 652b. In this case, a partial area of the extension portion 662 corresponding to the second capacitor electrode 652b may be disposed on the passivation layer 113. Therefore, the area of the extension portion 662 corresponding to the second capacitor electrode 652b may overlap the first capacitor electrode 651b with the passivation layer 113 therebetween.

In the display device 600 according to another exemplary aspect of the present disclosure, the number of insulating layers between the first capacitor electrode 651b and the second capacitor electrode 652b of the white sub pixel SPW may be smaller than the number of insulating layers between the first capacitor electrode 151a and the second capacitor electrode 152a of the red sub pixel SPR, the blue sub pixel SPB, and the green sub pixel SPG. Specifically, only the passivation layer 113 which is one insulating layer may be disposed between the first capacitor electrode 651b and the second capacitor electrode 652b of the white sub pixel SPW. Specifically, two insulating layers, that is, the buffer layer 111 and the gate insulating layer 112 may be disposed between the first capacitor electrode 151a and the second capacitor electrode 152a of the red sub pixel SPR, the blue sub pixel SPB, and the green sub pixel SPG. Therefore, a distance between the first capacitor electrode 651b and the second capacitor electrode 652b of the white sub pixel SPW may be relatively smaller than a distance between the first capacitor electrode 151a and the second capacitor electrode 152a of the red sub pixel SPR, the blue sub pixel SPB, and the green sub pixel SPG.

As the distance between the first capacitor electrode 651b and the second capacitor electrode 652b of the white sub pixel SPW is reduced, the capacitance required for the white sub pixel SPW is maintained and the area of the first capacitor electrode 651b may be reduced. Therefore, the area of the first capacitor electrode 651b and the second capacitor electrode 652b of the white sub pixel SPW may be smaller than an area of the first capacitor electrode 151a and the second capacitor electrode 152a of the red sub pixel SPR, the blue sub pixel SPB, and the green sub pixel SPG. Further, as much as the area of the storage capacitor 650b is reduced, the area where the light is emitted is increased so that the aperture ratio and the luminance may be increased.

Furthermore, in the white sub pixel SPW, the light leakage contributes to improvement of the aperture ratio and the luminance so that a separate structure for suppressing light leakage is not necessary. Therefore, the first capacitor electrode 651b and the second capacitor electrode 652b may not be formed of the same metal layer on the same layer as the first capacitor electrode 151a and the second capacitor electrode 152a of the red sub pixel SPR, the blue sub pixel SPB, and the green sub pixel SPG. Therefore, the first capacitor electrode 651b is disposed on the same layer as the first active layer 624b so that the material contained in the first active layer 624b becomes conductive. In this case, the buffer layer 111 and the substrate 110 are disposed below the first capacitor electrode 651b so that there is no metal layer. Further, the second capacitor electrode 652b is formed on the same layer as the first electrode 161 to be formed of the transparent conductive material, similarly to the first electrode 161. Accordingly, the blocking of the light which is emitted from the circuit area CA of the white sub pixel SPW due to the opaque metal layer is minimized and the aperture ratio and the luminance may be improved.

In the display device 600 according to another exemplary aspect of the present disclosure, the second capacitor electrode 652b of the white sub pixel SPW may be integrally formed with the extension portion 662 extending from the first electrode 161. That is, a part of the extension portion 662 serves as the second capacitor electrode 652b so that the extension portion 662 may have an area which completely overlaps the first capacitor electrode 651b. Therefore, the area of the extension portion 662 of the white sub pixel SPW may be larger than an area of the extension portion 162 of the red sub pixel SPR, the blue sub pixel SPB, and the green sub pixel SPG. In this case, the light emitting layer 164 and the second electrode 165 may be disposed on the extension portion 662. That is, the second capacitor electrode 652b may serve as a component of the storage capacitor 650a together with the first capacitor electrode 651a and also serve as a component of the light emitting diode together with the light emitting layer 164 and the second electrode 165. In other words, the light may be emitted from the storage capacitor 650b of the white sub pixel SPW. Accordingly, as much as the area occupied by the storage capacitor 650b in the circuit area CA of the white sub pixel SPW, the area where the light is emitted may be increased. As a result, the aperture ratio and the luminance of the white sub pixel SPW may be further increased and the luminous efficiency of the display device 600 may be improved.

The exemplary aspects of the present disclosure can also be described as follows:

According to an aspect of the present disclosure, there is provided a display device. The display device includes a substrate in which a plurality of sub pixels including an emission area and a circuit area is defined. The display device further includes a storage capacitor disposed in the circuit area and including a first capacitor electrode and a second capacitor electrode on the first capacitor electrode. The display device further includes a driving transistor disposed in the circuit area. The display device further includes a light emitting diode disposed in each of the plurality of sub pixels. The plurality of sub pixels includes a red sub pixel, a green sub pixel, a blue sub pixel, and a white sub pixel. And a distance between the first capacitor electrode and the second capacitor electrode in the white sub pixel is smaller than a distance between the first capacitor electrode and the second capacitor electrode in the red sub pixel, the green sub pixel, and the blue sub pixel.

An area of each of the first capacitor electrode and the second capacitor electrode in the white sub pixel may be smaller than an area of each of the first capacitor electrode and the second capacitor electrode in the red sub pixel, the green sub pixel, and the blue sub pixel.

The first capacitor electrodes of the plurality of sub pixels may be formed on the same layer, and the second capacitor electrode of the white sub pixel may be disposed below the second capacitor electrode of the red sub pixel, the green sub pixel, and the blue sub pixel.

The number of insulating layers between the first capacitor electrode and the second capacitor electrode in the white sub pixel may be smaller than the number of insulating layers between the first capacitor electrode and the second capacitor electrode in the red sub pixel, the green sub pixel, and the blue sub pixel.

The display device may further include a buffer layer disposed on the substrate and the first capacitor electrode and a gate insulating layer disposed below a first gate electrode of the driving transistor. The buffer layer and the gate insulating layer may be disposed between the first capacitor electrode and the second capacitor electrode in the red sub pixel, the green sub pixel, and the blue sub pixel. The buffer layer may be disposed between the first capacitor electrode and the second capacitor electrode in the white sub pixel.

The display device may further include a buffer layer disposed on the substrate, a gate insulating layer disposed below a first gate electrode of the driving transistor and a passivation layer disposed above the first gate electrode. The buffer layer and the gate insulating layer may be disposed between the first capacitor electrode and the second capacitor electrode in the red sub pixel, the green sub pixel, and the blue sub pixel. The passivation layer may be disposed between the first capacitor electrode and the second capacitor electrode in the white sub pixel.

The light emitting diode may include a first electrode disposed in the emission area and an extension portion extending from the first electrode to the circuit area. The extension portion of the white sub pixel may be integrally formed with the second capacitor electrode of the white sub pixel.

The extension portion of the white sub pixel may overlap the first capacitor electrode of the white sub pixel. An area of the extension portion of the white sub pixel may be larger than an area of the extension portion of the red sub pixel, the green sub pixel, and the blue sub pixel.

The display device may further include a planarization layer planarizing an upper portion of the driving transistor and the storage capacitor. The light emitting diode may include a first electrode on the planarization layer, a light emitting layer on the first electrode and disposed in the entire emission area and circuit area and a second electrode on the light emitting layer and disposed in the entire emission area and circuit area. The first electrodes of the plurality of sub pixels may be disposed to be spaced apart from each other. The light emitting layer may be disposed between the first electrodes which are spaced apart from each other.

According to another aspect of the present disclosure, there is provided a display device. The display device includes a substrate in which a plurality of sub pixels including a red sub pixel, a green sub pixel, a blue sub pixel, and a white sub pixel is defined. The display device further includes a storage capacitor disposed in each of the plurality of sub pixels and including a first capacitor electrode and a second capacitor electrode on the first capacitor electrode. The display device further includes a driving transistor disposed in each of the plurality of sub pixels. The display device further includes a light emitting diode disposed in each of the plurality of sub pixels. The number of insulating layers between the first capacitor electrode and the second capacitor electrode in the white sub pixel is smaller than the number of insulating layers between the first capacitor electrode and the second capacitor electrode in the red sub pixel, the green sub pixel, and the blue sub pixel.

A distance between the first capacitor electrode and the second capacitor electrode in the white sub pixel may be smaller than a distance between the first capacitor electrode and the second capacitor electrode in the red sub pixel, the green sub pixel, and the blue sub pixel.

An area of each of the first capacitor electrode and the second capacitor electrode in the white sub pixel may be smaller than an area of each of the first capacitor electrode and the second capacitor electrode in the red sub pixel, the green sub pixel, and the blue sub pixel.

The driving transistor may include a first active layer and a first gate electrode on the first active layer. The first capacitor electrode or the second capacitor electrode of the white sub pixel may be disposed on the same layer as the first active layer. Both the first capacitor electrode and the second capacitor electrode of the red sub pixel, the green sub pixel, and the blue sub pixel may be disposed on a layer different from the first active layer.

The first capacitor electrodes of the plurality of sub pixels may be formed on the same layer. The second capacitor electrode of the white sub pixel may be disposed below the second capacitor electrode of the red sub pixel, the green sub pixel, and the blue sub pixel.

The light emitting diode may include an anode disposed in each of the plurality of sub pixels and an extension portion extended from the anode toward the storage capacitor. The extension portion of the white sub pixel may be integrally formed with the second capacitor electrode of the white sub pixel.

The display device may further include a planarization layer which planarizing an upper portion of the driving transistor and the storage capacitor. The light emitting diode may include a plurality of anodes on the planarization layer in each of the plurality of sub pixels, a light emitting layer entirely disposed in the plurality of sub pixels to cover the plurality of anodes and a cathode entirely disposed in the plurality of sub pixels to cover the light emitting layer. A part of the light emitting layer may be disposed on the planarization layer.

According to yet another aspect of the present disclosure, there is provided a display device. The display device includes a substrate in which a plurality of sub pixels including an emission area and a circuit area is defined. The display device further includes a storage capacitor disposed in the circuit area and including a first capacitor electrode and a second capacitor electrode on the first capacitor electrode. The display device further includes a driving transistor disposed in the circuit area and including a first active layer and a first gate electrode on the first active layer. The display device further includes a light emitting diode disposed in each of the plurality of sub pixels. The plurality of sub pixels includes a red sub pixel, a green sub pixel, a blue sub pixel, and a white sub pixel. One of the first capacitor electrode and the second capacitor electrode of the white sub pixel is disposed on the same layer as the first active layer. Both the first capacitor electrode and the second capacitor electrode of the red sub pixel, the green sub pixel, and the blue sub pixel are disposed on a layer different from the first active layer.

The first capacitor electrodes of the plurality of sub pixels may be formed on the same layer. The second capacitor electrode of the white sub pixel may be disposed on the same layer as the first active layer. The second capacitor electrode of the red sub pixel, the green sub pixel, and the blue sub pixel may be disposed on the same layer as the first gate electrode.

The display device may further include a passivation layer on the first gate electrode and a planarization layer disposed on the passivation layer to expose a part of the passivation layer. The first capacitor electrode of the white sub pixel may be disposed on the same layer as the first active layer. The second capacitor electrode of the white sub pixel may be disposed on the passivation layer exposed by the planarization layer. The first capacitor electrode of the red sub pixel, the green sub pixel, and the blue sub pixel may be disposed below the first active layer. The second capacitor electrode of the red sub pixel, the green sub pixel, and the blue sub pixel may be disposed on the same layer as the first gate electrode.

The first capacitor electrode or the second capacitor electrode of the white sub pixel may include a conductive material changed from a material included in the first active layer. The second capacitor electrode of the red sub pixel, the green sub pixel, and the blue sub pixel may include the same material as the first gate electrode.

The display device may further include a light shielding layer disposed between the substrate and the first active layer. The first capacitor electrode of the red sub pixel, the green sub pixel, and the blue sub pixel may include the same material as the light shielding layer. The second capacitor electrode of the red sub pixel, the green sub pixel, and the blue sub pixel may include the same material as the first gate electrode. The first capacitor electrode of the white sub pixel may include the same material as the light shielding layer. The second capacitor electrode of the white sub pixel may include a conductive material changed from a material included in the first active layer.

The display device may further include a light shielding layer disposed between the substrate and the first active layer. The light emitting diode may include a first electrode, a light emitting layer, and a second electrode. The first capacitor electrode of the red sub pixel, the green sub pixel, and the blue sub pixel may include the same material as the light shielding layer. The second capacitor electrode of the red sub pixel, the green sub pixel, and the blue sub pixel may include the same material as the first gate electrode. The first capacitor electrode of the white sub pixel may include a conductive material changed from a material included in the first active layer. The second capacitor electrode of the white sub pixel may include the same material as the first electrode.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate in which a plurality of sub pixels including an emission area and a circuit area is defined;
   a storage capacitor disposed in the circuit area and including a first capacitor electrode and a second capacitor electrode on the first capacitor electrode;
   a driving transistor disposed in the circuit area; and
   a light emitting diode disposed in each of the plurality of sub pixels,
   wherein the plurality of sub pixels includes a red sub pixel, a green sub pixel, a blue sub pixel, and a white sub pixel, and
   wherein a distance between the first capacitor electrode and the second capacitor electrode in the white sub pixel is smaller than a distance between the first capacitor electrode and the second capacitor electrode in the red sub pixel, the green sub pixel, and the blue sub pixel.

2. The display device according to claim 1, wherein an area of each of the first capacitor electrode and the second capacitor electrode in the white sub pixel is smaller than an area of each of the first capacitor electrode and the second capacitor electrode in the red sub pixel, the green sub pixel, and the blue sub pixel.

3. The display device according to claim 1, wherein the first capacitor electrodes of the plurality of sub pixels are formed on a same layer, and the second capacitor electrode of the white sub pixel is disposed below the second capacitor electrode of the red sub pixel, the green sub pixel, and the blue sub pixel.

4. The display device according to claim 1, wherein the number of insulating layers between the first capacitor electrode and the second capacitor electrode in the white sub pixel is smaller than the number of insulating layers between the first capacitor electrode and the second capacitor electrode in the red sub pixel, the green sub pixel, and the blue sub pixel.

5. The display device according to claim 4, further comprising:
   a buffer layer disposed on the substrate and the first capacitor electrode; and
   a gate insulating layer disposed below a first gate electrode of the driving transistor,
   wherein the buffer layer and the gate insulating layer are disposed between the first capacitor electrode and the second capacitor electrode in the red sub pixel, the green sub pixel, and the blue sub pixel, and
   wherein the buffer layer is disposed between the first capacitor electrode and the second capacitor electrode in the white sub pixel.

6. The display device according to claim 4, further comprising:
   a buffer layer disposed on the substrate;
   a gate insulating layer disposed below a first gate electrode of the driving transistor; and
   a passivation layer disposed above the first gate electrode,
   wherein the buffer layer and the gate insulating layer are disposed between the first capacitor electrode and the second capacitor electrode in the red sub pixel, the green sub pixel, and the blue sub pixel, and
   wherein the passivation layer is disposed between the first capacitor electrode and the second capacitor electrode in the white sub pixel.

7. The display device according to claim 1, wherein the light emitting diode includes a first electrode disposed in the emission area and an extension portion extending from the first electrode to the circuit area, and
   wherein the extension portion of the white sub pixel is integrally formed with the second capacitor electrode of the white sub pixel.

8. The display device according to claim 7, wherein the extension portion of the white sub pixel overlaps with the first capacitor electrode of the white sub pixel, and
   wherein an area of the extension portion of the white sub pixel is larger than an area of the extension portion of the red sub pixel, the green sub pixel, and the blue sub pixel.

9. The display device according to claim 1, further comprising a planarization layer planarizing an upper portion of the driving transistor and the storage capacitor,
   wherein the light emitting diode includes:
   a first electrode disposed on the planarization layer;
   a light emitting layer disposed on the first electrode and disposed in the entire emission area and circuit area; and
   a second electrode disposed on the light emitting layer and disposed in the entire emission area and circuit area,
   wherein the first electrodes of the plurality of sub pixels are spaced apart from each other, and
   wherein the light emitting layer is disposed between the first electrodes which are spaced apart from each other.

10. A display device, comprising:
    a substrate in which a plurality of sub pixels including a red sub pixel, a green sub pixel, a blue sub pixel, and a white sub pixel is defined;

a storage capacitor disposed in each of the plurality of sub pixels and including a first capacitor electrode and a second capacitor electrode on the first capacitor electrode;

a driving transistor disposed in each of the plurality of sub pixels; and a light emitting diode disposed in each of the plurality of sub pixels, wherein the number of insulating layers between the first capacitor electrode and the second capacitor electrode in the white sub pixel is smaller than the number of insulating layers between the first capacitor electrode and the second capacitor electrode in the red sub pixel, the green sub pixel, and the blue sub pixel.

11. The display device according to claim 10, wherein a distance between the first capacitor electrode and the second capacitor electrode in the white sub pixel is smaller than a distance between the first capacitor electrode and the second capacitor electrode in the red sub pixel, the green sub pixel, and the blue sub pixel.

12. The display device according to claim 10, wherein an area of each of the first capacitor electrode and the second capacitor electrode in the white sub pixel is smaller than an area of each of the first capacitor electrode and the second capacitor electrode in the red sub pixel, the green sub pixel, and the blue sub pixel.

13. The display device according to claim 10, wherein the driving transistor includes a first active layer and a first gate electrode on the first active layer, wherein the first capacitor electrode or the second capacitor electrode of the white sub pixel is disposed on a same layer as the first active layer, and wherein both the first capacitor electrode and the second capacitor electrode of the red sub pixel, the green sub pixel, and the blue sub pixel are disposed on a layer different from the first active layer.

14. The display device according to claim 10, wherein the first capacitor electrodes of the plurality of sub pixels are formed on a same layer, and wherein the second capacitor electrode of the white sub pixel is disposed below the second capacitor electrode of the red sub pixel, the green sub pixel, and the blue sub pixel.

15. The display device according to claim 10, wherein the light emitting diode includes an anode disposed in each of the plurality of sub pixels and an extension portion extended from the anode toward the storage capacitor, and wherein the extension portion of the white sub pixel is integrally formed with the second capacitor electrode of the white sub pixel.

16. The display device according to claim 10, further comprising a planarization layer planarizing an upper portion of the driving transistor and the storage capacitor, wherein the light emitting diode includes:

a plurality of anodes on the planarization layer in each of the plurality of sub pixels;

a light emitting layer entirely disposed in the plurality of sub pixels to cover the plurality of anodes; and a cathode entirely disposed in the plurality of sub pixels to cover the light emitting layer, wherein a part of the light emitting layer is disposed on the planarization layer.

17. A display device, comprising:

a substrate in which a plurality of sub pixels including an emission area and a circuit area is defined;

a storage capacitor disposed in the circuit area and including a first capacitor electrode and a second capacitor electrode on the first capacitor electrode;

a driving transistor disposed in the circuit area and including a first active layer and a first gate electrode on the first active layer; and a light emitting diode disposed in each of the plurality of sub pixels, wherein the plurality of sub pixels includes a red sub pixel, a green sub pixel, a blue sub pixel, and a white sub pixel, wherein one of the first capacitor electrode and the second capacitor electrode of the white sub pixel is disposed on a same layer as the first active layer, and wherein both the first capacitor electrode and the second capacitor electrode of the red sub pixel, the green sub pixel, and the blue sub pixel are disposed on a layer different from the first active layer.

18. The display device according to claim 17, wherein the first capacitor electrodes of the plurality of sub pixels are formed on a same layer, wherein the second capacitor electrode of the white sub pixel is disposed on a same layer as the first active layer, and wherein the second capacitor electrode of the red sub pixel, the green sub pixel, and the blue sub pixel is disposed on a same layer as the first gate electrode.

19. The display device according to claim 17, further comprising:

a passivation layer on the first gate electrode; and a planarization layer disposed on the passivation layer to expose a part of the passivation layer, wherein the first capacitor electrode of the white sub pixel is disposed on a same layer as the first active layer, wherein the second capacitor electrode of the white sub pixel is disposed on the passivation layer exposed by the planarization layer, wherein the first capacitor electrode of the red sub pixel, the green sub pixel, and the blue sub pixel is disposed below the first active layer, and wherein the second capacitor electrode of the red sub pixel, the green sub pixel, and the blue sub pixel is disposed on a same layer as the first gate electrode.

20. The display device according to claim 17, wherein the first capacitor electrode or the second capacitor electrode of the white sub pixel includes a conductive material changed from a material included in the first active layer, and wherein the second capacitor electrode of the red sub pixel, the green sub pixel, and the blue sub pixel includes a same material as the first gate electrode.

21. The display device according to claim 17, further comprising a light shielding layer disposed between the substrate and the first active layer, wherein the first capacitor electrode of the red sub pixel, the green sub pixel, and the blue sub pixel includes a same material as the light shielding layer, wherein the second capacitor electrode of the red sub pixel, the green sub pixel, and the blue sub pixel includes a same material as the first gate electrode, wherein the first capacitor electrode of the white sub pixel includes a same material as the light shielding layer, and wherein the second capacitor electrode of the white sub pixel includes a conductive material changed from a material included in the first active layer.

22. The display device according to claim 17, further comprising a light shielding layer disposed between the substrate and the first active layer,
- wherein the light emitting diode includes a first electrode, a light emitting layer, and a second electrode,
- wherein the first capacitor electrode of the red sub pixel, the green sub pixel, and the blue sub pixel includes a same material as the light shielding layer,
- wherein the second capacitor electrode of the red sub pixel, the green sub pixel, and the blue sub pixel includes a same material as the first gate electrode,
- wherein the first capacitor electrode of the white sub pixel includes a conductive material changed from a material included in the first active layer, and
- wherein the second capacitor electrode of the white sub pixel includes a same material as the first electrode.

\* \* \* \* \*